United States Patent [19]

Kamohara et al.

[11] Patent Number: 5,422,496
[45] Date of Patent: *Jun. 6, 1995

[54] INTERBAND SINGLE-ELECTRON TUNNEL TRANSISTOR AND INTEGRATED CIRCUIT

[75] Inventors: Shiroo Kamohara; Toru Toyabe, both of Kokubunji; Kozo Katayama, Koganei; Shuichi Yamamoto, Sayama; Sigeo Ihara, Hachioji, all of Japan

[73] Assignee: Hitachi, Ltd., Tokyo, Japan

[*] Notice: The portion of the term of this patent subsequent to Nov. 2, 2010 has been disclaimed.

[21] Appl. No.: 117,801

[22] Filed: Sep. 8, 1993

Related U.S. Application Data

[63] Continuation of Ser. No. 961,547, Oct. 15, 1992, Pat. No. 5,258,625.

[30] Foreign Application Priority Data

Oct. 15, 1991 [JP]  Japan .................................. 3-265940

[51] Int. Cl.⁶ ............................................. H01L 29/88
[52] U.S. Cl. ......................................... 257/24; 257/25; 257/27; 257/204; 257/105
[58] Field of Search ............... 257/23, 25, 30, 37, 257/38, 39, 104, 105, 204, 14, 49, 24, 27

[56] References Cited

U.S. PATENT DOCUMENTS

| | | | |
|---|---|---|---|
| 4,829,343 | 5/1989 | Levi ........................................ | 257/26 |
| 4,843,447 | 6/1989 | Harris et al. ............................ | 257/17 X |
| 4,926,221 | 5/1990 | Levi ........................................ | 257/26 |
| 5,258,625 | 11/1993 | Kamohara et al. .................... | 257/14 |

OTHER PUBLICATIONS

Likharev, "Single-Electron Transistors:Electrostatic Analogs of the DC Squids", *IEEE Transactions on Magnetics*, vol. MAG-23, No. 2, Mar., 1987, pp. 1142-1145.
Landauer, "Can We Switch by Control of Quantum Mechanical Transmission?, " *Physics Today*, Oct., 1989, pp. 119-121.
Takeda, "Reliability and Device Structure in Submicron MOS Devices," *Tech. Reports of IECIE*, SDM90-119, Nov. 1990, pp. 1-8.
"LSI", *Journal of Physics of Japan*, vol. 46, No. 5, 1991, pp. 352-359.

*Primary Examiner*—William Mintel
*Attorney, Agent, or Firm*—Antonelli, Terry, Stout & Kraus

[57] ABSTRACT

An interband single-electron tunnel/transistor utilizes an interband single-electron tunneling phenomenon between a valence band and a conduction band through a p-n junction. The transistor includes the combination of microcapacities as fundamental constituent elements each formed by joining a p-type semiconductor material doped with an impurity in the degree of concentration with which a Fermi level overlaps a valence band and an n-type semiconductor material doped with an impurity in the degree of concentration with which the Fermi level overlaps a conduction band. The microcapacity includes a p-n junction having a junction area with which interband electron tunneling is inhibited due to Coulomb blockade.

13 Claims, 22 Drawing Sheets

FIG. 18A-A
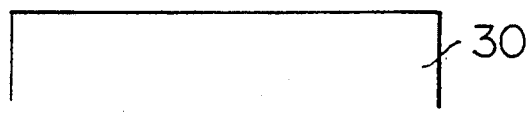
FIG. 18B-B
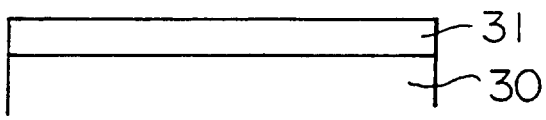
FIG. 18C-C
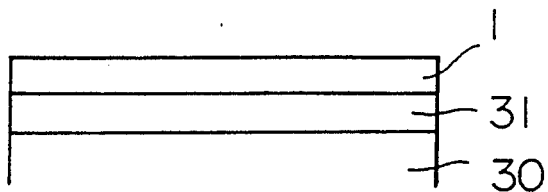
FIG. 18D-D
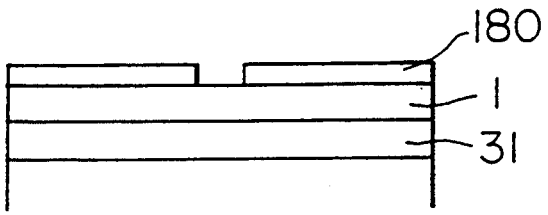

FIG. 19A-E
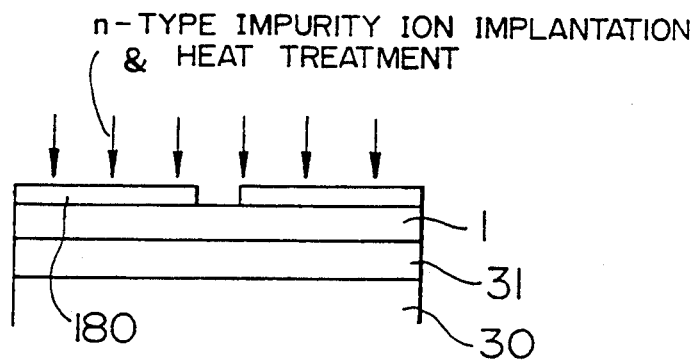
FIG. 19B-F
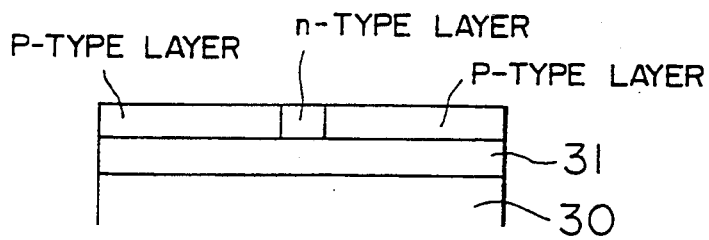
FIG. 20
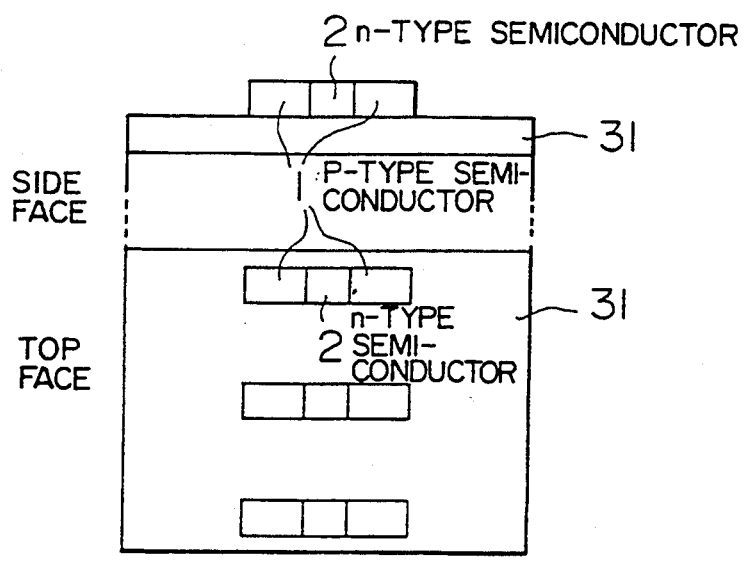

FIG. 21A-G
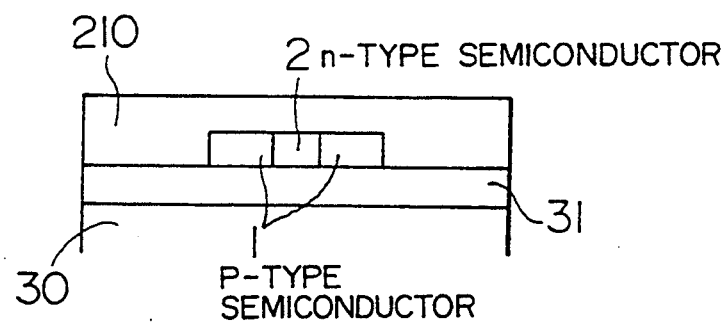
FIG. 21B-H
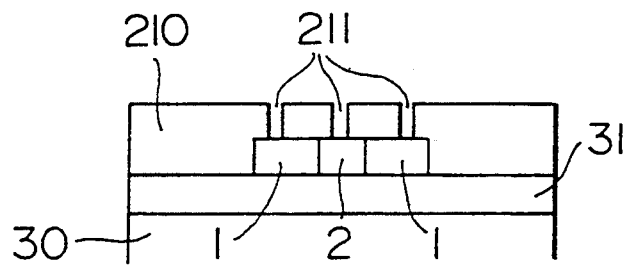

FIG. 22A-I
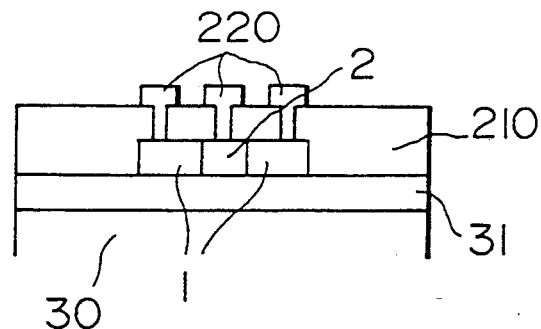
FIG. 22B-J
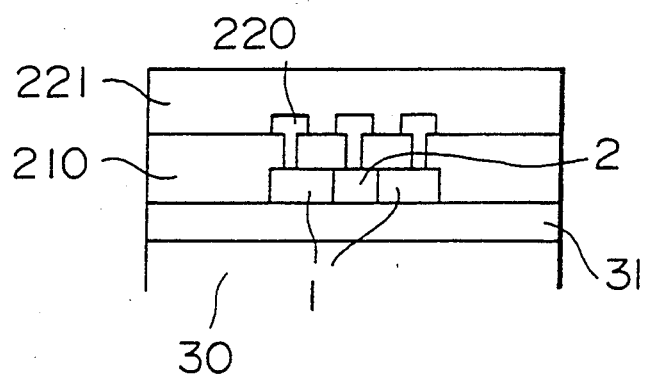
FIG. 22C-K
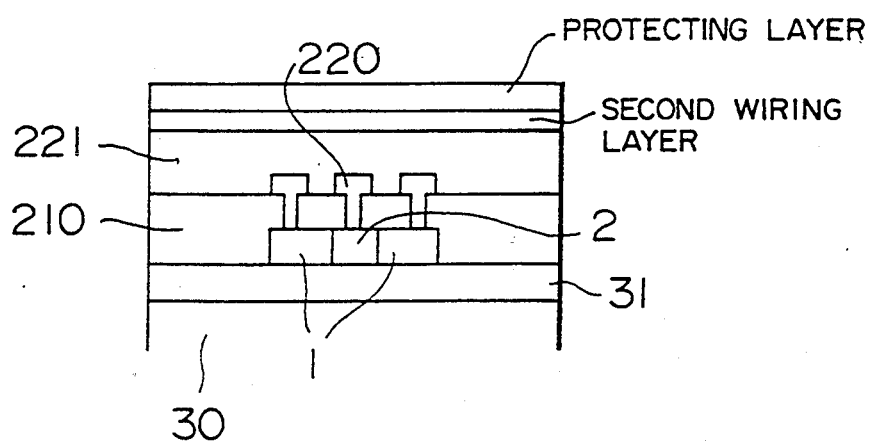

SOURCE-DRAIN VOLTAGE

INTERBAND SINGLE-ELECTRON TUNNEL TRANSISTOR AND INTEGRATED CIRCUIT

This is a continuation of application Ser. No. 961,547, filed Oct. 15, 1992, now U.S. Pat. No 5,258,625.

BACKGROUND OF THE INVENTION

The present invention, relates to an interband single-electron tunnel transistor and integrated circuit utilizing a single-electron tunneling phenomenon, or more particularly, an interband single-electron tunneling phenomenon between a valence band and a conduction band in a p-n junction.

It is believed that about the time when the MOS device would have a channel length region of $\frac{1}{4}$ μm, further fine processing by integration technique for the conventional VLSI would become difficult, as disclosed in, for example, Journal of Physics of Japan, Vol. 46, No. 5, (1991), pp. 352–359 and TECH. REPORTS OF IECIE, November (1990), pp. 1–8, SDM90-119. Since many advances in integrated circuits are supported by an unceasing advance in fine processing, the above hindrance will become a great issue in the near future. In order to solve such a problem, devices utilizing quantum effects have been proposed actively.

There are many kinds of devices utilizing quantum effects. The most general device is an electron-wave interference device which utilizes the wave property of an electron. In the electron-wave interference device, quantum-mechanical electron waves are made to interfere with each other to strengthen or weaken themselves and using the same in connection with realizing a switching operation in the device. However, the prior electron-wave interference device involves several problems. In Physics Today, October (1989), pp. 119–121, it is pointed out that the characteristics of an electron-wave interference device greatly change depending upon a minute change of its device structure and it is the view that the application of the electron-wave interference device to an integrated circuit is difficult. Also, in the above Journal of Physics Society of Japan, Vol. 46, No. 5, (1991), pp. 352–359, it is pointed out that the ratio of a conductance of an electron-wave interference device in its ON state to that in its OFF state is small by several orders as compared with the conventional MOS device and, also because of this, it is the view, therefore, that the application of the electron-wave interference device to an integrated circuit is difficult.

In order to solve the above problems of the electron-wave interference device, there has been proposed a single-electron tunnel transistor which utilizes the particle property of electron. As shown by, for example, IEEE, Trans. Magnetics, MAG-23 (1987), pp. 1142–1145 and Parity, Vol. 5, No. 10, (1990), pp. 22–28, the single-electron tunnel transistor includes as its fundamental constituent element a microcapacity having an electrostatic capacitance on the order of fF (femtofarad = $10^{-15}$ F) and utilizes a quantum phenomenon peculiar to the microcapacity called Coulomb blockade.

The microcapacity for forming the single-electron tunnel transistor has a structure in which an insulating layer is sandwiched between two conducting materials. The insulating layer is made thin so as to allow the tunneling of an electron between the two conducting materials. In such a microcapacity, a phenomenon that the tunneling of an electron from one of the conducting materials to the other through the insulating layer is inhibited in a temperature range of $T < e^2/(2Ck)$ and in a potential difference range of $-e/(2C) < V < e/(2C)$, is called Coulomb blockage. Herein, T is the temperature, V the potential difference across the microcapacity, e the charge amount of one electron, C the electrostatic capacitance of the microcapacity, and k the Boltzmann constant. Accordingly, if the electrostatic capacitance of the microcapacity is made small by making the area of the capacity small, the Coulomb blockade can be realized in a higher state in temperature and in a higher state in potential difference or voltage across the capacity.

When the potential difference across the microcapacity exceeds a value defined by the above condition of Coulomb blockade, a release from the Coulomb blockade is made so that single-electron tunneling occurs between conducting materials. In a single-electron tunnel transistor including such a microcapacity formed as a fundamental constituent element, the flowing of current between the source and the drain is inhibited due to the Coulomb blockade when a gate voltage is turned off and is allowed because of a release from the Coulomb blockade when the gate voltage is turned on. In the single-electron tunnel transistor, the ratio of a conductance in an ON state to that in an OFF state is large as compared with the electron-wave interference device and the characteristics of the device are not almost influenced by a minute change in structure.

In the conventional single-electron tunnel transistor, an electron passes through the insulating layer each time the gate voltage is turned on. In general, the passage of electrons through an insulating layer causes the deterioration of the insulating layer. In the conventional single-electron tunnel transistor, therefore, there arises a problem that since an electron passes through the insulating layer each time the gate voltage is turned on, the deterioration of the insulating layer is advanced, thereby remarkably deteriorating the reliability of the device. Also, in the conventional single-electron tunnel transistor, since the microcapacity is formed by sandwiching the insulating layer between two conducting materials, the fabrication process is very complicated. Accordingly, it is supposed that many problems in the fabrication process will arise in the case where an integrated circuit is to be formed.

Namely, in the conventional single-electron tunnel transistor, since an insulating layer which is a path of electrons is used as a portion of the microcapacity, the lifetime of the device is shortened and the reliability thereof is deteriorated. Also, owing to the presence of the insulating layer, the fabrication process is complicated and it becomes difficult to form an integrated circuit.

SUMMARY OF THE INVENTION

An object of the present invention is to provide an interband single-electron tunnel transistor in which the avoidance of the deterioration of an insulating layer and the improvement of the reliability of the device are attained by using a microcapacity with no insulating layer as a fundamental constituent element of the single-electron tunnel transistor and the fabrication process is simplified because of a decrease in the number of insulating layers by one. Another object of the present invention is to provide an integrated circuit which uses such single-electron tunnel transistors and is suitable for high integration.

In the present invention, a p-n junction microcapacity causing an-interband single-electron tunneling phenomenon is used, in place of the conventional microcapacity, as a fundamental constituent element of a single-electron tunnel transistor. The p-n junction is formed by joining a p-type semiconductor material with an impurity doped such that a Fermi level overlaps a valence band at a designated operation temperature and an n-type semiconductor material with an impurity doped such that the Fermi level overlaps a conduction band at the designated operation temperature. Also, the p-n junction has a depletion layer width with which the interband tunneling of an electron from the valence band of the p-type semiconductor material to the conduction band of the n-type semiconductor material or the interband tunneling of an electron in a reverse direction is allowed at the designated operation temperature. For example, in the case where silicon is used as a substrate material, a depletion layer width to allow the tunneling is not larger than 150 Å.

Further, the p-n junction has a junction area with which the interband tunneling of an electron from the valence band of the p-type semiconductor material to the conduction band of the n-type semiconductor material or the interband tunneling of an electron in the reverse direction is inhibited due to Coulomb blockade at the designated operation temperature and a designated microcapacity voltage. The capacitance of the p-n junction can simply be estimated from the value of the depletion layer width. Further, the area of the p-n junction required is determined from the condition of Coulomb blockade and the operation temperature and voltage of the transistor. The Coulomb blockade condition is derived on the basis of analysis of increase/decrease of free energy.

By using the above p-n junction microcapacity, it is possible to remove from the microcapacity an insulating layer used in the conventional microcapacity. In contrast with the conventional microcapacity in which an electron tunnels between conducting materials having an insulating layer sandwiched therebetween, the microcapacity of the present invention exhibits the interband tunneling of an electron in the depletion layer when the electron moves from the valence band of the p-type semiconductor material to the conduction band of the n-type semiconductor material or vice versa. Accordingly, the present invention can overcome the problem of the deterioration of an insulating layer which is a problem in the prior art.

Further, in the p-n junction of the present invention, since a capacity is abiogenetically formed at a junction interface, the width of the capacity can be controlled by the impurity concentrations of the p-type and n-type semiconductor materials. Accordingly, the present invention can overcome the problem of the complication of the fabrication process attendant upon the formation of an insulating layer which is a problem in the prior art.

As apparent from the foregoing, the use of an interband single-electron tunnel device of the present invention makes it possible to realize a single-electron tunnel transistor in which not only the deterioration of an insulating layer is avoided and the reliability of the device is improved but also the fabrication process is much simplified since the number of insulating layers is decreased by one. Also, since the interband single-electron tunnel transistor of the present invention is small in device size as compared with the conventional device, it can be used to realize an integrated circuit of SRAM's, gate array or the like with high integration.

BRIEF DESCRIPTION OF THE DRAWINGS

FIGS. 18A—A to 18D—D are first views for explaining a method for fabrication of an integrated circuit using interband single-electron transistors;

FIGS. 19A–E and 19B–F are second views for explaining the method for fabrication of the integrated circuit using interband single-electron transistors;

FIG. 20 is a third view for explaining the method for fabrication of the integrated circuit using interband single-electron transistors;

FIGS. 21A–G and 21B–H are fourth views for explaining the method for fabrication of the integrated circuit using interband single-electron transistors;

FIGS. 22A–I to 22C–K are fifth views for explaining the method for fabrication of the integrated circuit using interband single-electron transistors;

DESCRIPTION OF THE PREFERRED EMBODIMENTS

Figure 23:
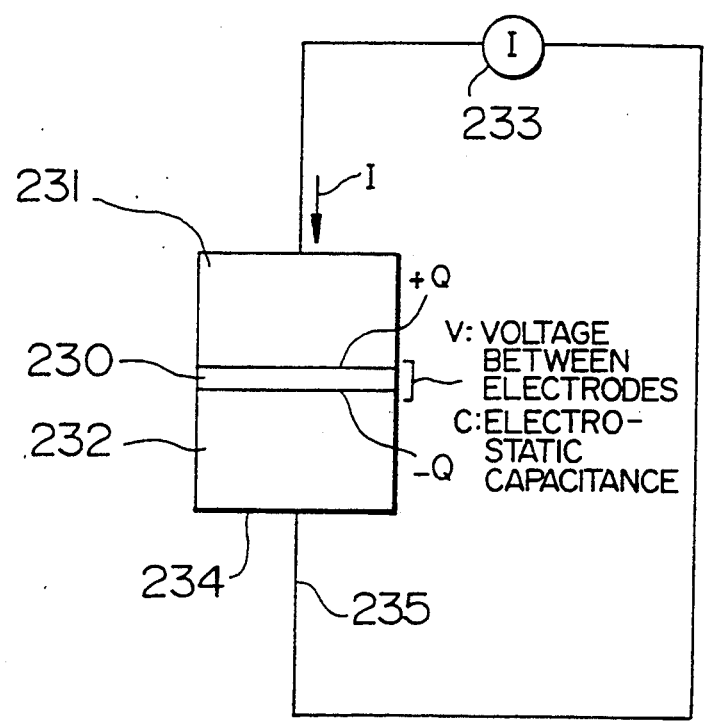
FIG. 23 is a first diagram for explaining a single-electron tunneling phenomenon.

First of all, a single-electron tunneling phenomenon, which is the principle of operation of a transistor of the present invention, will be explained with reference to FIGS. 23 to 27. FIG. 23 is a conceptual diagram of a microcapacity which causes the single-electron tunneling phenomenon, that is, a single-electron tunnel capacity 234. The microcapacity 234 has a structure in which an insulating layer 230 is sandwiched between two conducting materials 231 and 232. The thickness of the insulating layer 230 is made so small that the tunneling of an electron between the conducting materials is allowed. The area of the microcapacity 234 is made so small that an electrostatic capacitance is on the order of fF (femtofarad = $10^{-15}$ F). The microcapacity 234 is connected to a constant current source 233. In the case where a constant current I is injected into the microcapacity having the electrostatic capacitance of the order of fF from the constant current source 233, a phenomenon called Coulomb blockade occurs. The Coulomb blockade is a phenomenon that the tunneling of an electron between conducting materials is inhibited when a voltage between the conducting materials is in a certain range.

Figure 24:
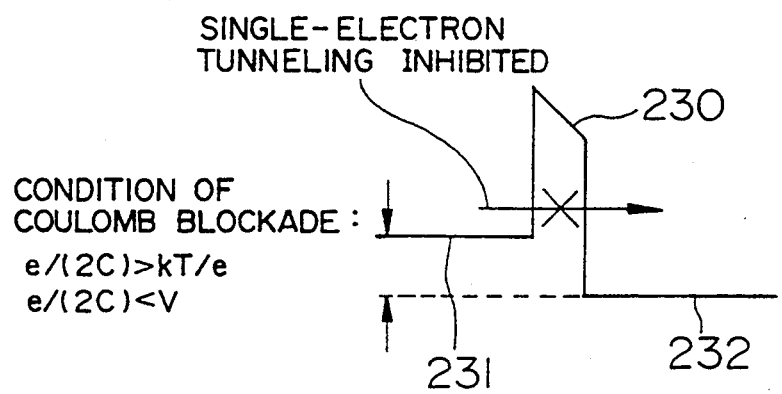
FIG. 24 is a second diagram for explaining the single-electron tunneling phenomenon.

FIG. 24 is a simplified diagram illustrating the principle of the Coulomb blockade. The figure represents a state in which the tunneling of an electron between the conducting materials 231 and 232 is inhibited under a condition that a temperature T is in a range of $$T < e^2/(2Ck) \quad (1)$$

and a difference V in potential between the conducting materials is $$-e/(2C) < V < e/(2C) \quad (2)$$

where T is the temperature, V a potential difference or voltage across the microcapacity, e the charge amount of one electron, C the electrostatic capacitance of the microcapacity, and k the Boltzmann constant. The condition given by the relations (1) and (2) is called the condition of Coulomb blockade.

Accordingly, it can be understood from the condition of Coulomb blockade that if the electrostatic capacitance of the microcapacity is made small by reducing the area of the microcapacity, the Coulomb blockade can be realized at a higher temperature and a higher voltage across the microcapacity. If the potential difference across the microcapacity exceeds a value defined by the condition of Coulomb blockade so that a release from the Coulomb blockade is made, one electron passes through the insulating layer 230 between the conducting materials 231 and 132. This is called a single-electron tunneling phenomenon. Accordingly, the circuit shown in FIG. 23 shows circuit characteristics peculiar to the single-electron tunneling phenomenon.

Figure 25:
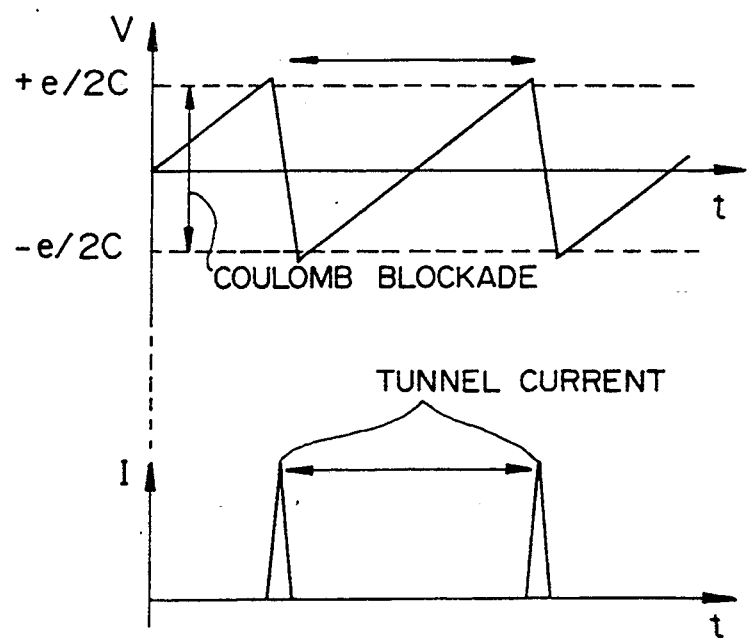
FIG. 25 is a third diagram for explaining the single-electron tunneling phenomenon.

FIG. 25 shows temporal changes of a potential difference between electrodes and a tunnel current between electrodes in the circuit shown in FIG. 23. Under the condition of the above relation (2), the tunneling of an electron between the electrodes is inhibited due to the Coulomb blockade. Therefore, charge $\pm Q$ injected into the electrodes from the constant current source 233 is accumulated between the conducting materials 231 and 233 as it is. Namely, the amount of charge accumulated between the electrodes and the potential difference between the electrodes increase with the increase of time. However, if the amount of charges injected from the current source exceeds the condition of the relation (2), a release from the Coulomb blockade is made so that a single-electron current flows as a tunnel current which passes through the insulating layer 230. When the single-electron current flows, the potential difference between the electrodes is inverted. Accordingly, the potential difference between the electrodes in the circuit shown in FIG. 23 oscillates at a period T, as shown in FIG. 25. This phenomenon is generally called a single-electron tunnel oscillation.

Figure 26:
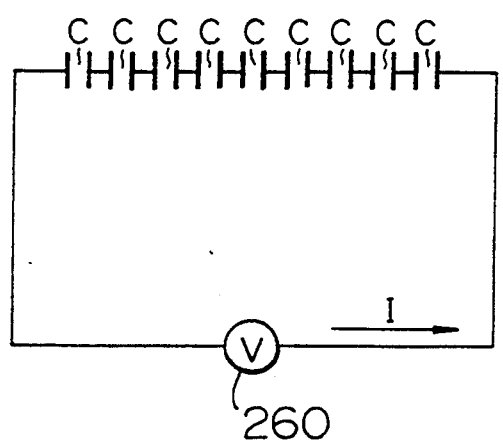
FIG. 26 is a diagram showing a multiple single-electron tunnel junction circuit.
Figure 27:
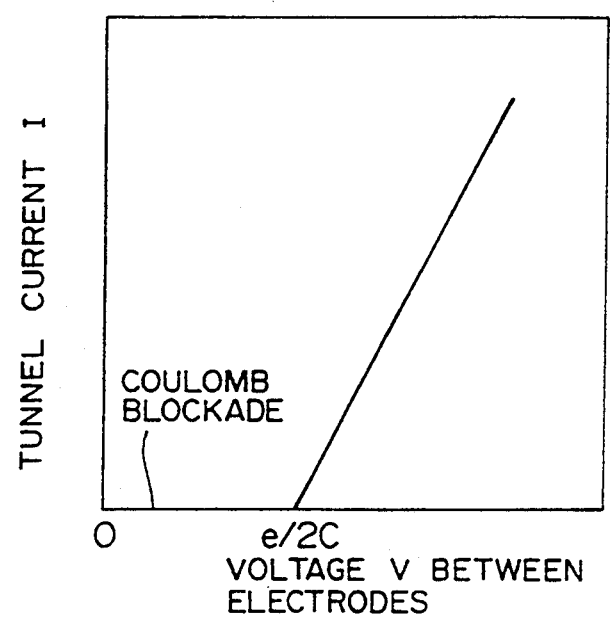
FIG. 27 is a diagram showing a current versus voltage characteristic of the multiple single-electron tunnel junction circuit.

Next, the operation of a circuit including a multiple of series-connected microcapacities C will be explained using FIG. 26. The circuit of FIG. 26 is different from the circuit of FIG. 23 in that the capacities are connected to a constant voltage source 260. In the circuit shown in FIG. 26 in which the multiple of microcapacities are connected in series and are connected to the constant voltage source 260, the influence of the Coulomb blockade on circuit characteristics appears in a form quite different from that in the circuit shown in FIG. 23. FIG. 27 shows a current versus voltage characteristic of the circuit shown in FIG. 26. When the multiple of microcapacities C are connected in series, as shown in FIG. 26, the whole electrostatic capacitance becomes small and hence an upper limit value of voltage satisfying the condition of Coulomb blockade becomes large, thereby facilitating the control of the current versus voltage characteristic.

In the circuit shown in FIG. 26, the single-electron tunneling phenomenon and the conventional single-electron tunnel transistor have been explained on the basis of the condition of Coulomb blockade. In the conventional single-electron tunnel transistor, however, an electron passes through an insulating layer each time a gate voltage is turned on. In general, an insulating layer is deteriorated if electrons pass through the insulating layer. Accordingly, the conventional single-electron tunnel transistor involves a problem that the deterioration of the insulating layer advances upon each turn-on of the gate voltage, thereby remarkably deteriorating the reliability of the device. Also, since the microcapacity is formed by sandwiching the insulating layer between two conducting materials, the fabrication process is very complicated. Accordingly, it is supposed that many problems in the fabrication process arise in the case where an integrated circuit is to be formed.

Figure 30:
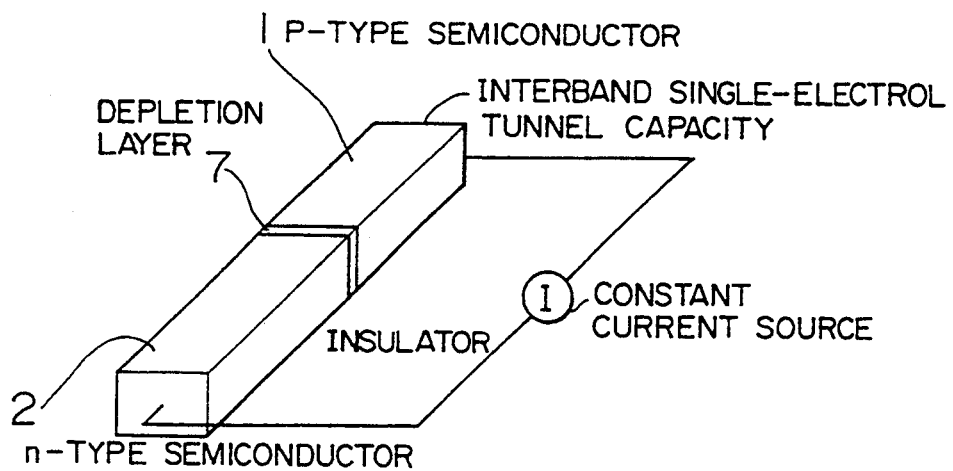
FIG. 30 is a view for explaining an interband single-electron tunnel junction.

Next, an embodiment of a microcapacity, which is a fundamental constituent element of a single-electron tunnel transistor of the present invention using no insulating layer, will be explained with reference to FIGS. 30 and 31. FIG. 30 is a conceptual diagram of an interband single-electron tunnel transistor of p-n junction type which is one embodiment of the present invention. In a p-n junction, the junction area corresponds to the capacity area and the width of a depletion layer 7 corresponds to a distance between electrodes. The p-n junction shown in FIG. 30 is formed by joining a p-type semiconductor material 1 with an impurity concentration such that a Fermi level 10 shown in FIG. 31 overlaps a valence band 12 at a designated operation temperature and an n-type semiconductor material 2 with an impurity concentration such that the Fermi level 10 overlaps a conduction band 11 at the designated operation temperature.

Also, there is in the p-n junction a depletion layer, through which the interband tunneling of an electron from the valence band 12 of the p-type semiconductor material 1 to the conduction band 11 of the n-type semiconductor material 2 or the interband tunneling of an electron in a reverse direction is allowed at the designated operating temperature. For example, in the case where silicon is used as a substrate material, a depletion layer width to allow the tunneling is not greater than 150 Å.

Further, the p-n junction has a junction area for which the interband tunneling of an electron from the valence band 12 of the p-type semiconductor material 1 to the conduction band 11 of the n-type semiconductor material 2 or the interband tunneling of an electron in the reverse direction is inhibited due to the Coulomb blockade at the designated operation temperature and a designated microcapacity voltage. A condition under which the Coulomb blockade occurs at the designated temperature, is the above relation (1). A condition under which the Coulomb blockade occurs at the designated microcapacity voltage, is the relation (2).

Also, the area of the p-n junction required is determined from the condition of Coulomb blockade, the capacitance of the p-n junction and the operation temperature and voltage of the transistor. In the following, a specific example of calculation concerning the p-n junction area will be shown. In the case where it can be assumed that the p-n junction is a step junction, the junction capacitance C of the p-n junction is given by $$C = \epsilon (S/d) \quad (3)$$

$$d = \sqrt{(2\epsilon/e)(N_p + N_n)V_t/(N_p \cdot N_n)} \quad (4)$$

where $\epsilon$ is the dielectric constant of the semiconductor material, S the junction area, d the depletion layer width, $N_p$ the concentration of the p-type impurity, $N_n$ the concentration of the n-type impurity, and $V_t$ a difference between the Fermi level of the p-type semiconductor material 1 measured from a vacuum level and that of the n-type Semiconductor material 2. For example, in the case where the semiconductor material is silicon, $\epsilon$ is $1.04 \times 10^{-12}$ F/cm and $V_t$ is about 1.11 V. The above equation (4) is one example of a calculation equation for depletion layer width and the calculation equation for depletion layer width differs depending upon the profile of distribution of the n-type and p-type impurities. When the above parameter values in the case of silicon are used on the assumption that each of the p-type semiconductor material 1 and the n-type semiconductor material 2 has the impurity of about $1.0 \times 10^{19}$ cm$^{-3}$, the value of d given by the above equation (4) is about 10 nm.

This depletion layer width can be controlled by changing the impurity concentration. In the case where silicon is used, the width of a depletion layer to allow tunneling is not greater than 150 Å (=15 nm). Accordingly, in the depletion layer width shown above, the interband tunneling of an electron from the valence band 12 of the p-type semiconductor material 1 to the conduction band of the n-type semiconductor material 2 or the interband tunneling of an electron in a reverse direction becomes possible.

Next, the calculation of the junction area required for causing an interband single-electron tunnel transistor including as a fundamental constituent element a p-n junction satisfying the above impurity injection or doping condition is made using the relations (1) and (2) in conjunction with the case where the transistor is operated at a temperature of 4K and an ON/OFF threshold voltage of 0.1 mV. According to the result of calculation, a p-n junction having a junction area of $(0.1 \mu m)^2$ is required for operating the interband single-electron tunnel transistor under the above condition. Since the processing of line width 0.1 $\mu m$ is possible by using the existing microlithography technique, the p-n junction with the junction area of $(0.1 \mu m)^2$ is in a processable or workable range. Accordingly, if a p-n junction having a depletion layer with the width of 10 nm and a junction area of $(0.1 \mu m)^2$ is used as a fundamental constituent element of an interband single-electron tunnel transistor, the operation temperature of the device is 4K and the ON/OFF threshold voltage is 0.1 mV. Such operation temperature and voltage are acceptable to allow the application of the transistor as a device.

Figure 28:
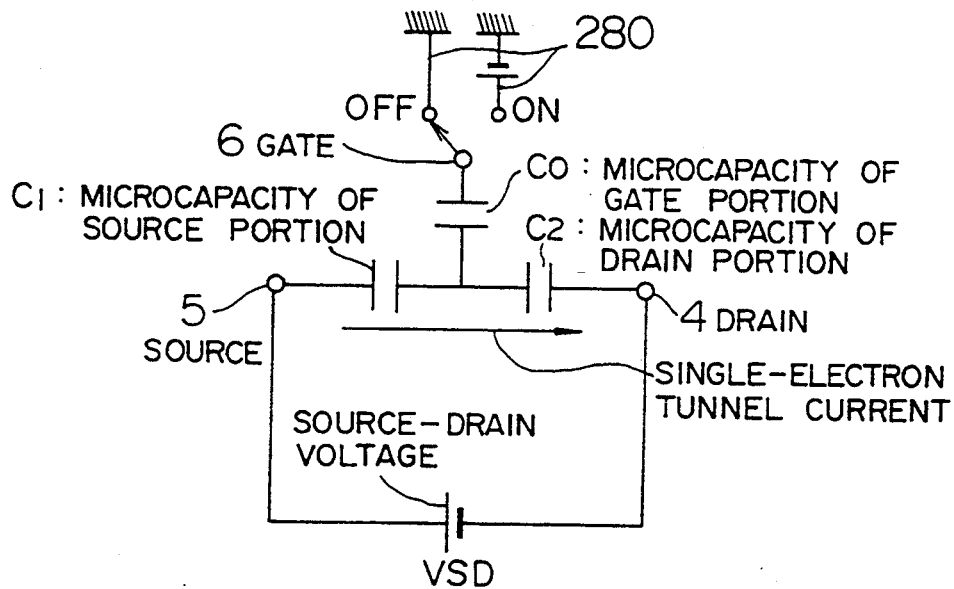
FIG. 28 is a diagram showing the operation of a single-electron tunnel transistor.
Figure 29:
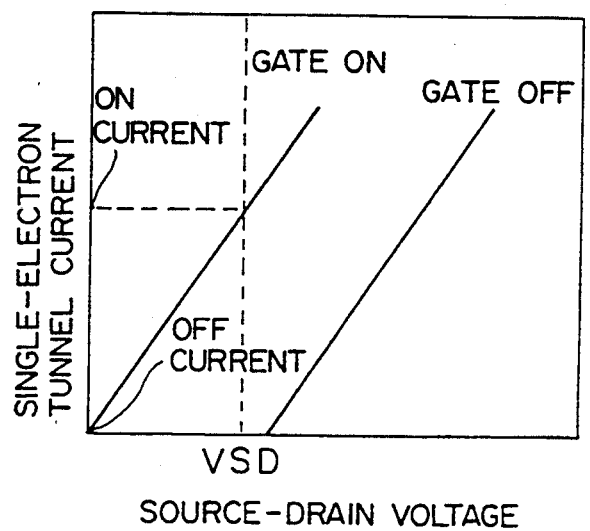
FIG. 29 is a diagram showing a switching characteristic of the single-electron tunnel transistor.
Figure 31:
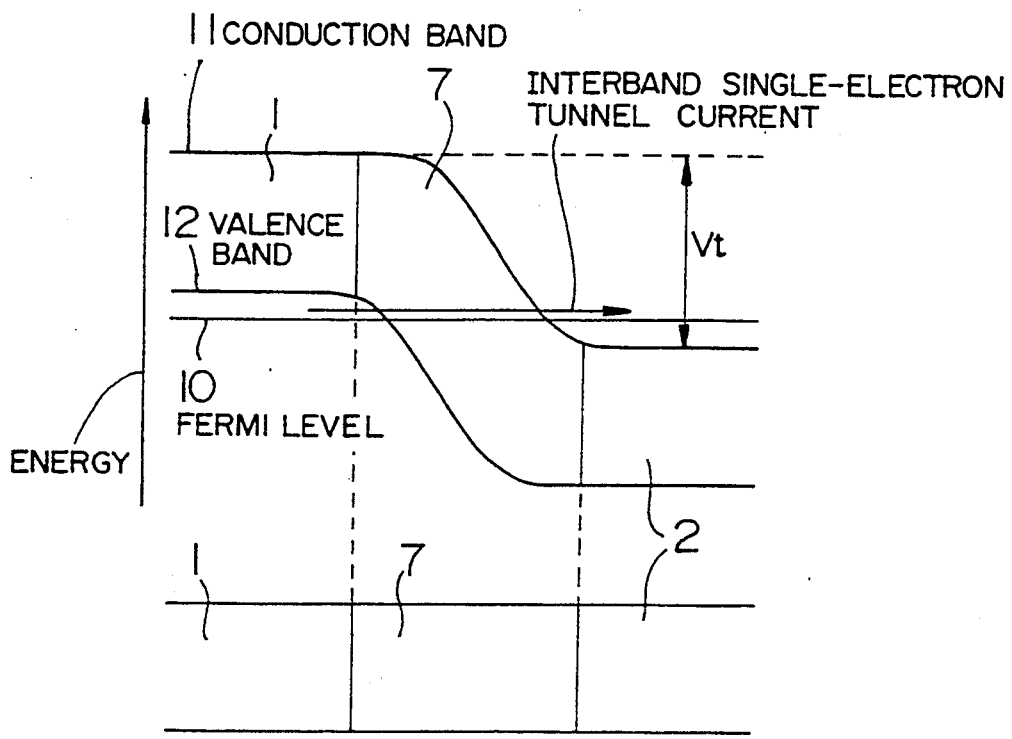
FIG. 31 is a conceptual diagram for explaining the operation of an interband single-electron tunneling.

FIG. 31 shows the principle of operation of the interband single-electron tunneling. An electron interband-tunnels from the valence band 12 of the p-type semiconductor material 1 to the conduction band 11 of the n-type semiconductor material 2 or from the conduction band 11 of the n-type semiconductor material 2 to the valence band 12 of the p-type semiconductor material 1. The depletion layer 7 shown in FIG. 31 corresponds to the insulating layer 230 shown in FIG. 24. The electrostatic capacitance of the depletion layer 7 is given by the equations (3) and (4). The width of the depletion layer 7 has almost no change at an operation voltage of about 1 mV. As shown in FIG. 28, this junction type tunnel capacity can be used to form an interband single-electron tunnel junction transistor which has a structure similar to that of the single-electron tunnel transistor. The transistor shown in FIG. 28 includes a drain 4, a source 5 and a gate 6 each of which is composed of a junction type tunnel capacity. A gate voltage switch 280 is connected to the gate 6. A voltage versus current characteristic as shown in FIG. 29 is obtained by ON/OFF of the gate. Accordingly, a switching operation for a predetermined voltage $V_{SD}$ is obtained.

Figure 32:
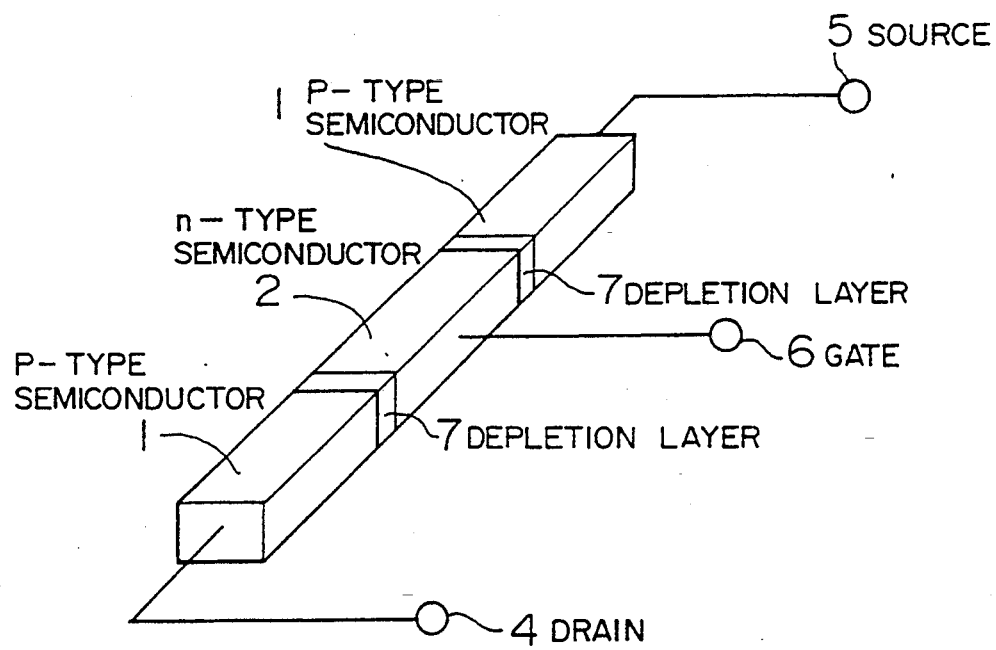
FIG. 32 is a view showing the construction of an interband single-electron tunnel transistor.

FIG. 32 shows an embodiment of the structure of the interband single-electron tunnel transistor. The interband single-electron tunnel transistor of the present invention has a structure similar to that of the conventional lateral bipolar transistor but has a small junction area and impurity concentrations which are required by the condition of Coulomb blockade. The interband single-electron tunnel transistor has a fundamental structure in which an n-type semiconductor material 2 is sandwiched between two p-type semiconductor materials 1 or a fundamental structure in which a p-type semiconductor material 1 is sandwiched between two n-type semiconductor materials 2. In the structure shown in FIG. 32, semiconductor portions 1 of the same conductivity type on opposite sides correspond to a source 5 and a drain 4, respectively, and a semiconductor portion 2 of a different conductivity type in the middle corresponds to a gate 6. The gate 6 makes an operation of ON/OFF of a single-electron tunnel current between the source and the drain for a fixed source-drain voltage. The structure shown in FIG. 32 can be used to realize a switching device which uses an interband single-electron tunneling phenomenon.

Figure 33:
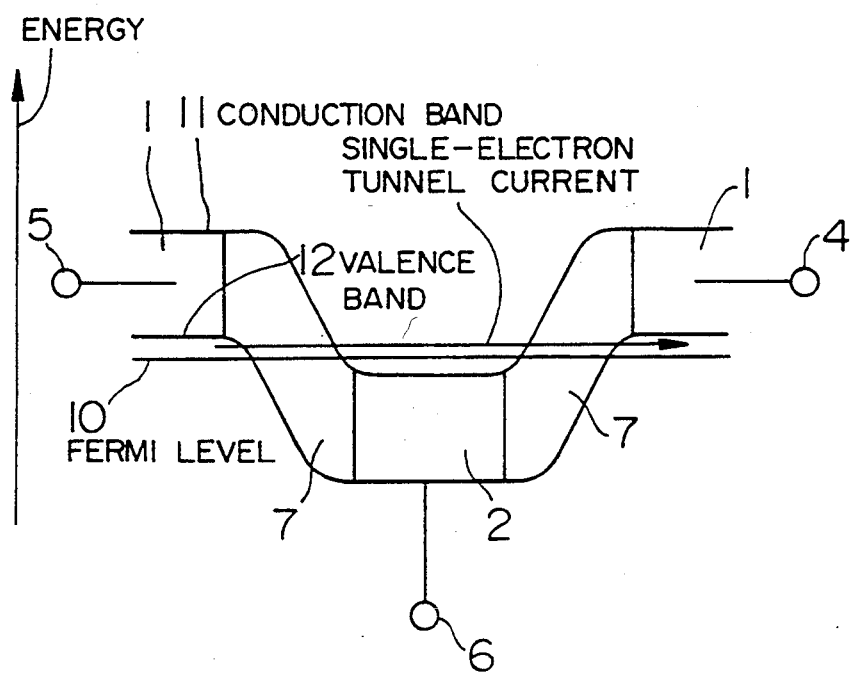
FIG. 33 is a conceptual diagram for explaining the operation of the interband single-electron tunnel transistor.

FIG. 33 shows the principle of operation of the interband single-electron tunnel transistor. The principle of operation of the interband single-electron tunnel transistor is quite different from that of the conventional bipolar transistor. The conventional bipolar transistor is a device which principally uses electrons and holes. Accordingly, it is not possible to operate the bipolar transistor at low temperatures since no hole exists at the low temperatures. As for the interband single-electron tunnel transistor, however, it is possible to operate the transistor at low temperatures since only electrons are used as carriers. A single-electron tunnel current passes through a conduction band 11 of the n-type semiconductor material 2 from a valence band 12 of the p-type semiconductor material 1 and reaches the valence band 12 of the p-type semiconductor material 1. The amount of this single-electron tunnel current can be controlled by changing a gate voltage. In the interband single-electron tunnel transistor, the reliability of the device is improved since a p-n junction microcapacity is used as a fundamental constituent element of the single-electron tunnel transistor. Further, since an insulating layer forming a capacity is removed, the fabrication process is much simplified. Accordingly, in contrast with the conventional single-electron tunnel transistor, the interband single-electron tunnel transistor of the present invention can easily be used to form an integrated circuit.

Figure 1:
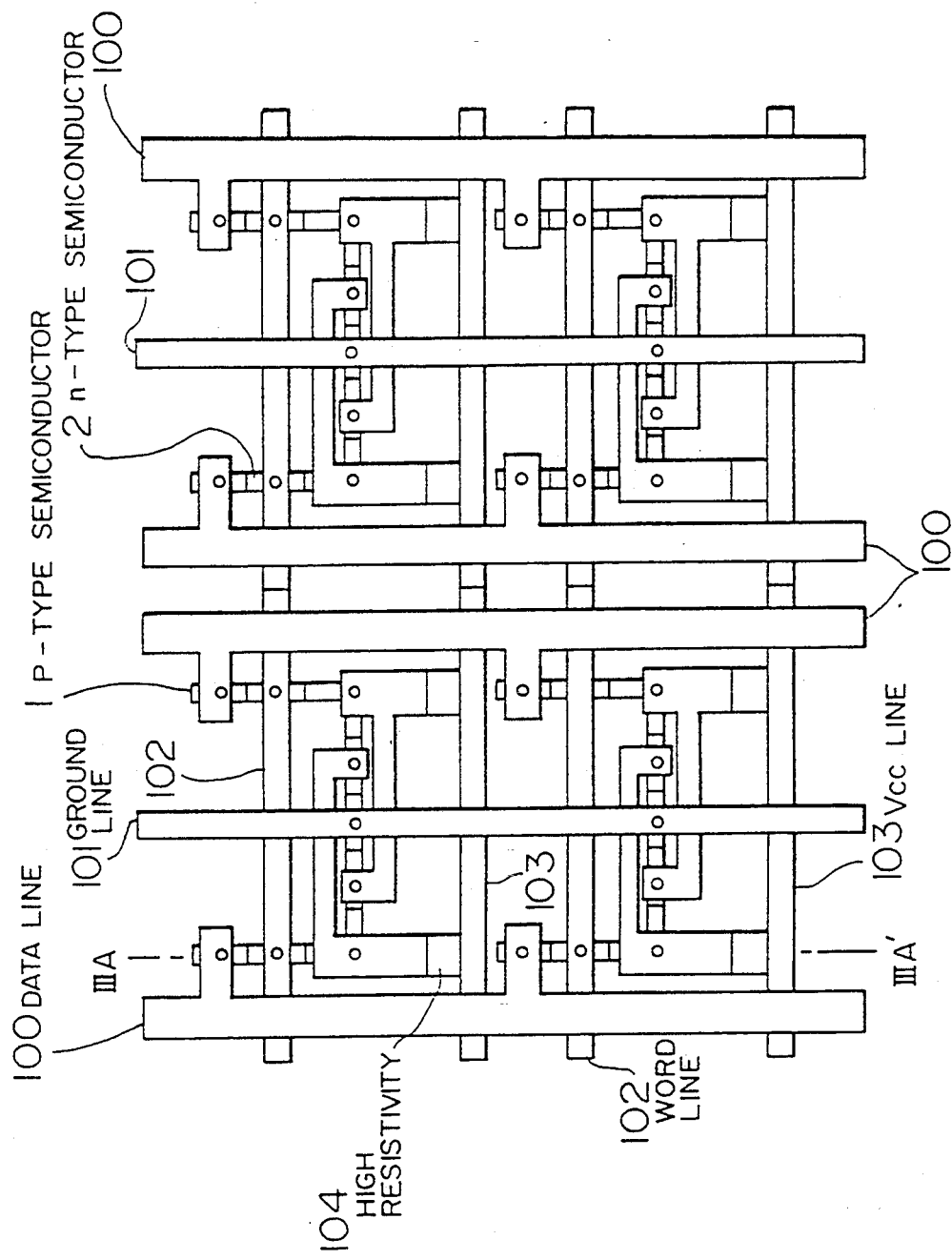
FIG. 1 is a view for explaining a structure including four interconnected interband single-electron transistor SRAM cells.

FIG. 1 shows an embodiment of the structure of SRAM cells using the interband single-electron tunnel transistors of the present invention. More particularly, FIG. 1 shows an embodiment of a structure in which four SRAM cells are connected. Each cell is enclosed by two data lines 100, a word line 102 for designating an address of a memory, and a $V_{CC}$ line 103 for supplying an electric power. A ground line 101 runs at the middle portion of each cell. In FIG. 1, the cells are arranged in the same direction.

Figure 2:
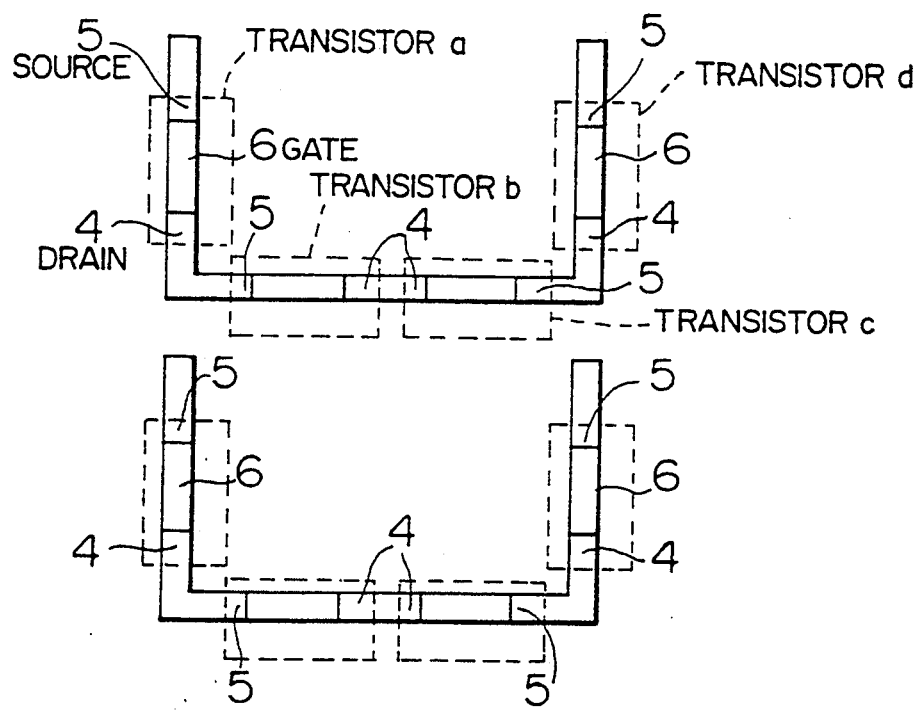
FIG. 2 is a view showing the construction of one interband single-electron transistor SRAM cell.

Each SRAM cell according to the present invention includes four interband single-electron tunnel transistors a to d, as shown in FIG. 2. The cell including the four interband single-electron tunnel transistors has a structure in which a drain 4 of the transistor a and a source 5 of the transistor b are held in common, a drain 4 of the transistor b and a drain 4 of the transistor c are held in common, and a source 5 of the transistor c and a drain 4 of the transistor d are held in common. The common use of the source 5 and the drain 4 of different transistors improves the integration degree of an integrated circuit. As shown in FIG. 2, in the present embodiment, the four interband single-electron tunnel transistors including the common use of the drain 4 and the source 5 or the drain 4 and the drain 4 are arranged with a U-like structure as a whole. A plurality of cells each including such four interband single-electron tunnel transistors of the U-like structure are arranged periodically to form an integrated circuit.

Figure 34:
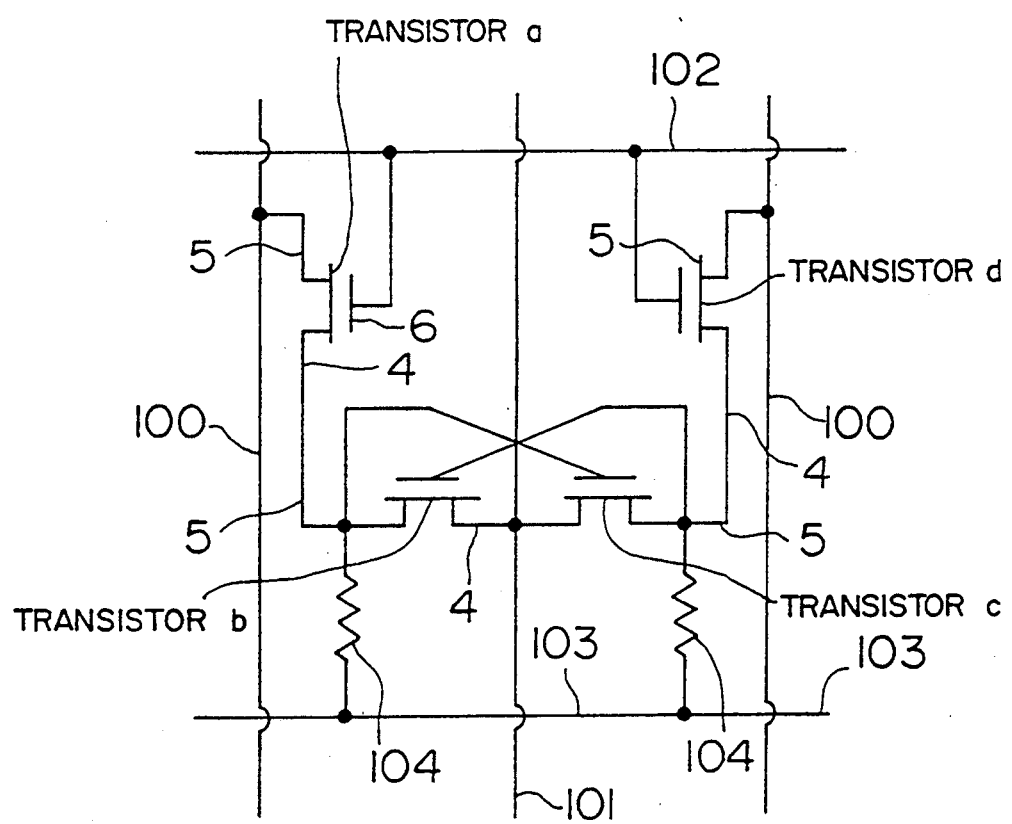
FIG. 34 is an equivalent circuit diagram of an interband single-electron tunnel transistor SRAM cell.

Next, explanation will be made of wiring between transistors in the case where a SRAM cell is formed using the four interband single-electron tunnel transistors of the U-like structure. The explanation will be made with reference to FIG. 34 which shows an equivalent circuit of the SRAM cell according to the present invention. A word line 102 is connected to the gates 6 of a transistor a and a transistor d. The source 5 of a transistor b and the gate 6 of a transistor c are connected by wiring and this connection line is connected through a high resistivity 104 to a $V_{CC}$ power supply line 103. Similarly, the source 5 of the transistor c and the gate 6 of the transistor b are connected by wiring and this connection line is connected through a high resistivity 104 to the $V_{CC}$ line 103. A ground line 101 is connected to the drains 4 of the transistors b and c used in common. Two data lines 100 are connected to the source 5 of the transistor a and the source 5 of the transistor d, respectively. The data line 100 and the ground line 101 are provided in the second wiring or interconnection layer of a substrate, and the other wirings are provided in the first wiring layer of the substrate. FIG. 1 shows an embodiment of the structure of four interconnected SRAM cells each of which includes four interband single-electron tunnel transistors of the U-like structure, as shown in FIG. 2, actually subjected to the wiring or interconnection according to the equivalent circuit shown in FIG. 24.

Figure 3:
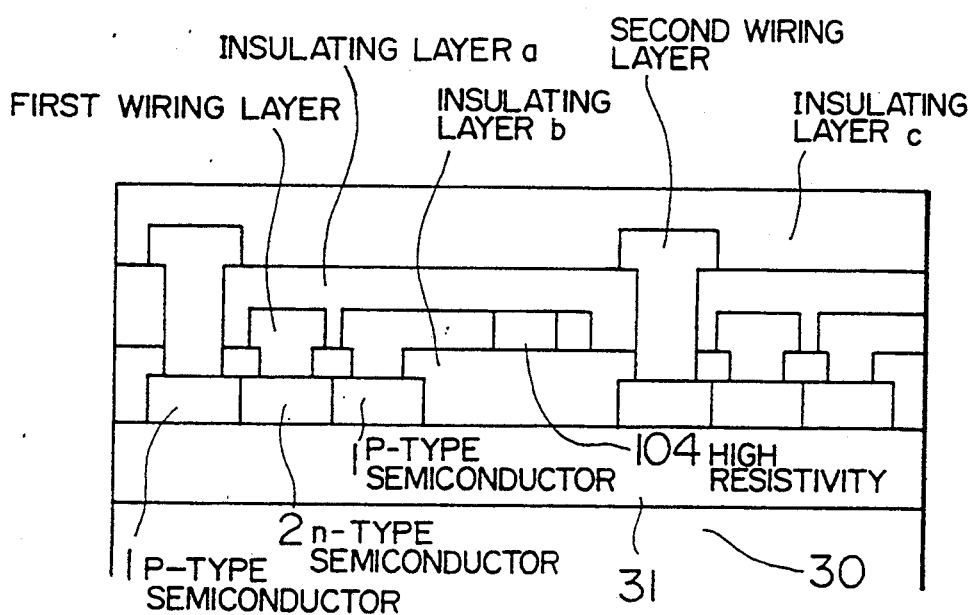
FIG. 3 is a cross section of the interband single-electron transistor-SRAM cell taken along line IIIA–IIIA' in FIG. 1.

Next, an embodiment of the cross-sectional structure of the interband single-electron tunnel transistor SRAM shown in FIG. 1 will be explained with reference to FIG. 3. FIG. 3 shows a cross section taken along line IIIA–IIIA' in FIG. 1. An insulating layer 31 is formed on a substrate 30, and interband single-electron tunnel transistors are formed on the insulating layer 31. The data line 100 and the ground line 101 are provided in the second wiring layer and the other wirings are provided in the first wiring layer. Insulators a, b and c are used as protecting layers for wirings. In the case where silicon (Si) is used as the material of the substrate 30, silicon dioxide ($SiO_2$) is used as the insulating layer 31. Further, poly-silicon doped with boron (B) is used as a p-type semiconductor material 1 and poly-silicon doped with phosphor (P) or arsenic (As) is used as an n-type semiconductor material 2. A material such as silicon dioxide used as a protecting layer in the conventional semiconductor manufacturing process is used as the insulators a, b and c which are the wiring protection layers. In the case where GaAs is used as the material of the substrate 30, AlGaAs is used as the insulating layer 31. Further, GaAs doped with beryllium-(Be) or zinc (Zn) is used as the p-type semiconductor-material 1 and GaAs doped with silicon or platinum (Pt) is used as the n-type semiconductor material 2.

In the conventional bipolar transistor, since a base width becomes wide, so that the most of minority carriers are extinguished in a base region, it was not possible to realize a SRAM cell which has a structure according to the present invention. This problem in the conventional bipolar transistor originates from the operation of the bipolar transistor which uses both of electrons and holes. The interband single-electron tunnel transistor of the present invention can avoid this problem since the transistor can operate by virtue of only electrons.

Figure 4:
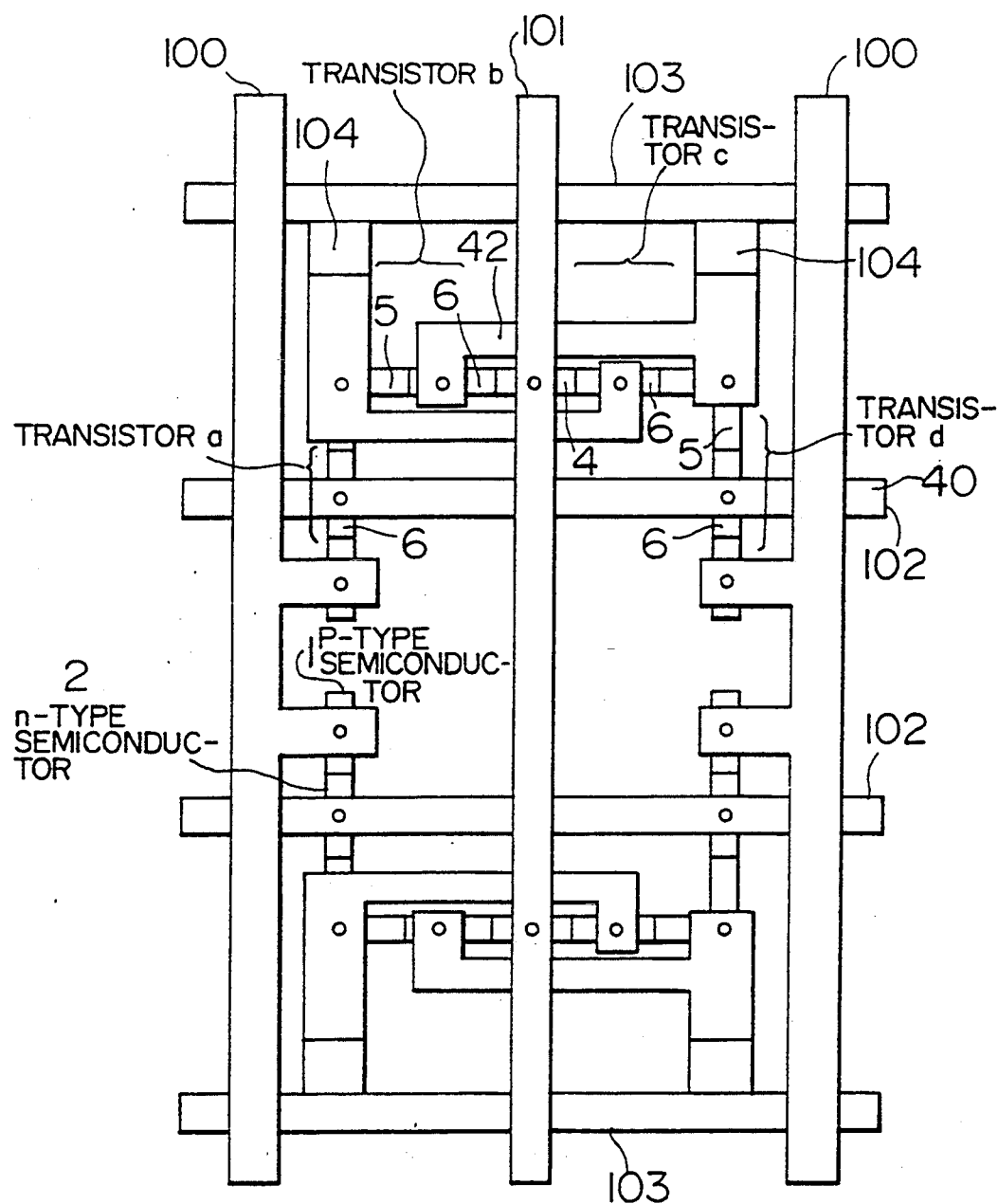
FIG. 4 is a view showing another embodiment of an interband single-electron transistor SRAM cell.
Figure 5:
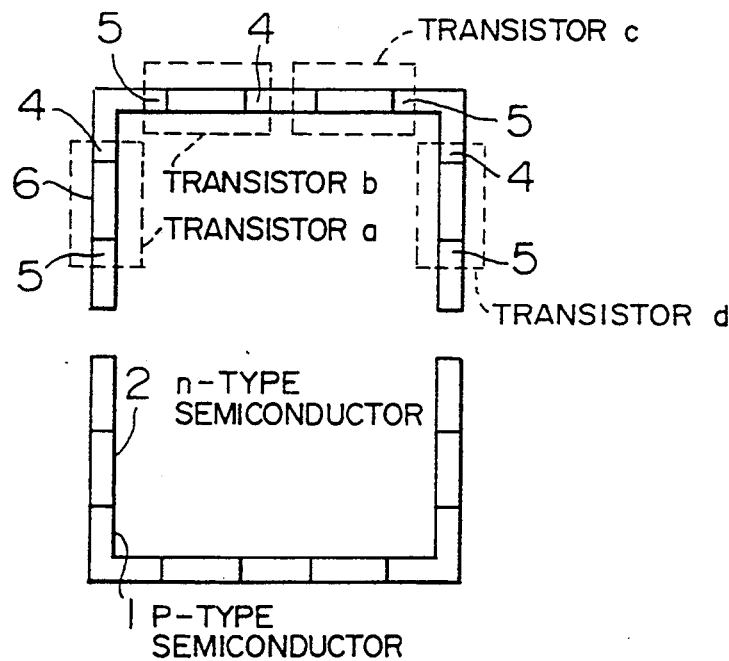
FIG. 5 is a view for explaining a further embodiment of an interband single-electron transistor SRAM cell.
Figure 6:
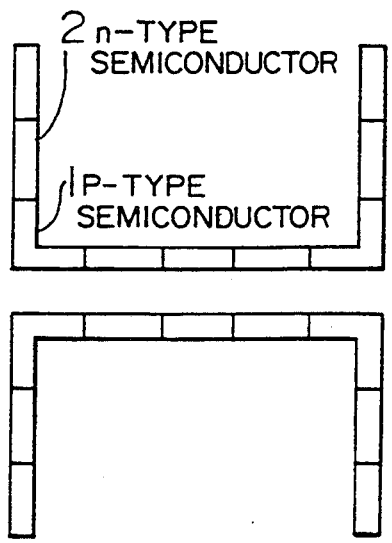
FIG. 6 is a view for explaining a still further embodiment an interband single-electron transistor SRAM cell.

Next, other embodiments of the SRAM cell according to the present invention will be explained with reference to FIGS. 4, 5 and 6. In the foregoing embodiment, a plurality of SRAM cells each including four interband single-electron tunnel transistors having a U-like structure are arranged periodically, as shown in FIG. 2. FIGS. 5 and 6 show different embodiments in which the arrangement of four interband single-electron tunnel transistors of the U-like structure is changed between cells. Namely, in FIGS. 5 and 6, a plurality of cells each including four interband single-electron transistors of the U-like structure are arranged in a direction of the data line 100 with the direction or sense of the transistor being inverted at every other cell. The unit of wiring as shown in FIG. 1 is different between FIGS. 2, 5 and 6. Especially, in FIGS. 5 and 6, the directions of transistors in two adjacent cells are geometrically equivalent to each other but the unit of wiring is different when local wiring is considered in the case where wiring as shown in FIG. 1 is made.

The manner of arrangement differs depending upon the circuit design configuration, the wiring method, or the like. In the case where an integrated circuit is actually formed, various structures shown in FIGS. 2, 5 and 6 can be combined in the circuit. FIG. 4 shows an embodiment of wiring in the case where the manner of arrangement shown in FIG. 5 is used. Namely, FIG. 4 shows a structure in which two adjacent transistors using the data line 100 in common in the arrangement shown in FIG. 1 are arranged facing each other. In FIG. 4, one (40) of word lines 102 is connected to the gates 6 of a transistor a and a transistor d. The source 5 of a transistor b and the gate 6 of a transistor c are connected by a wiring line 41, and this wiring line 41 is connected through a high resistivity 104 to a $V_{CC}$ power supply line 103. Similarly, the source 5 of the transistor c and the gate 6 of the transistor b are connected by a wiring line 42, and this wiring line 42 is connected through a high resistivity 104 to the $V_{CC}$ power supply line 103. A ground line 101 is connected to the drains 4 of the transistors b and c used in common. Two data lines 100 are connected to the source 5 of the transistor a and the source 5 of the transistor d, respectively.

Figure 7:
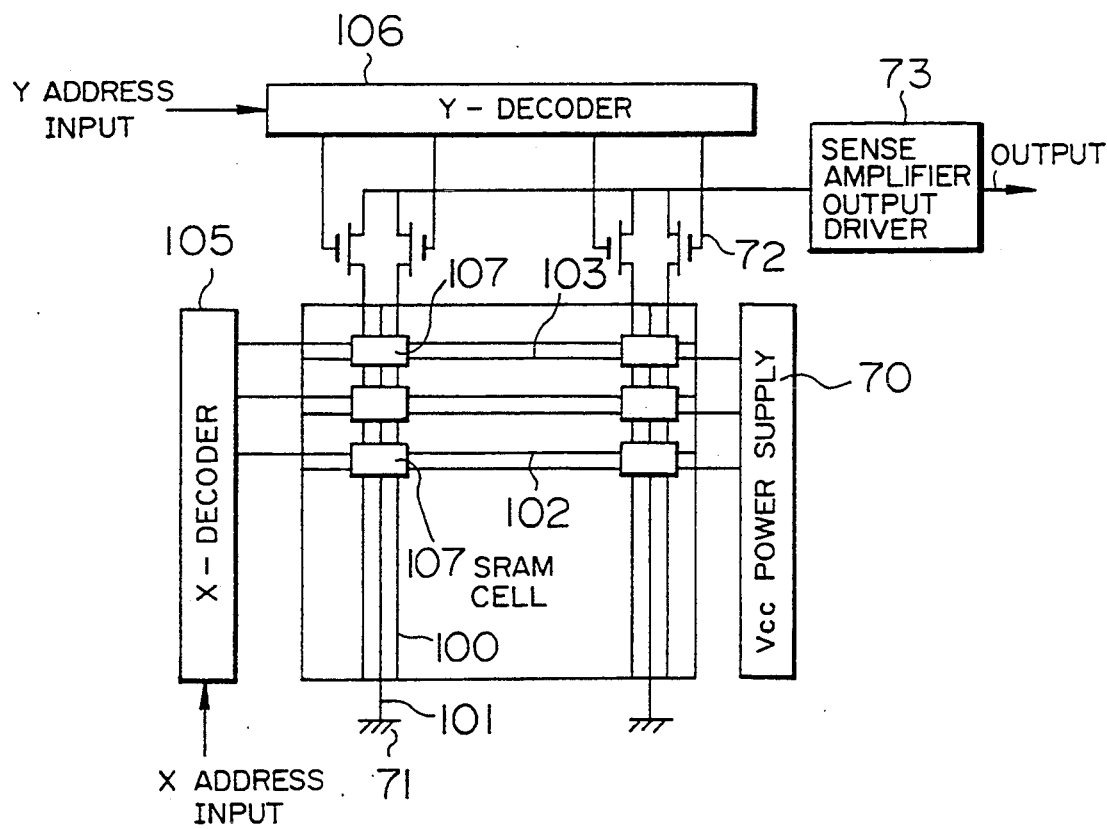
FIG. 7 is a conceptual view of a peripheral devices in an interband single-electron transistor SRAM.

FIG. 7 shows an embodiment of peripheral devices of an integrated circuit using interband single-electron tunnel transistor SRAM cells of the present invention. The peripheral devices of a SRAM using interband single-electron tunnel transistors include an X-decoder 105, a Y-decoder 106, a $V_{CC}$ power supply 70, the ground 71, read control transistors 72, and a sense amplifier output driver 73. The X-decoder 105 is connected to word lines 102, and the Y-decoder 106 is connected to data lines 100. The timing of write of data into the circuit and the timing of read of data from the circuit are controlled by the X-decoder 105 and the Y-decoder 106. The read control transistor 72 is a circuit for allowing the sense amplifier output driver 73 to make access to information of a SRAM cell 107 address-designated. The sense amplifier output driver 73 is a device for reading data written in the SRAM cell 107. The sense amplifier output driver 73 makes access through the read control transistor 72 to data written in the SRAM cell 107 address-designated by the X-decoder 105 and address-designated by the Y-decoder 106. Since a signal of the interband single-electron tunnel transistor is very weak in principle, a circuit for amplifying the signal is incorporated in the sense amplifier output driver 73. The $V_{CC}$ power supply 70 and the ground 71 are set such that designated lines hold their designated constant potential conditions.

Figure 8:
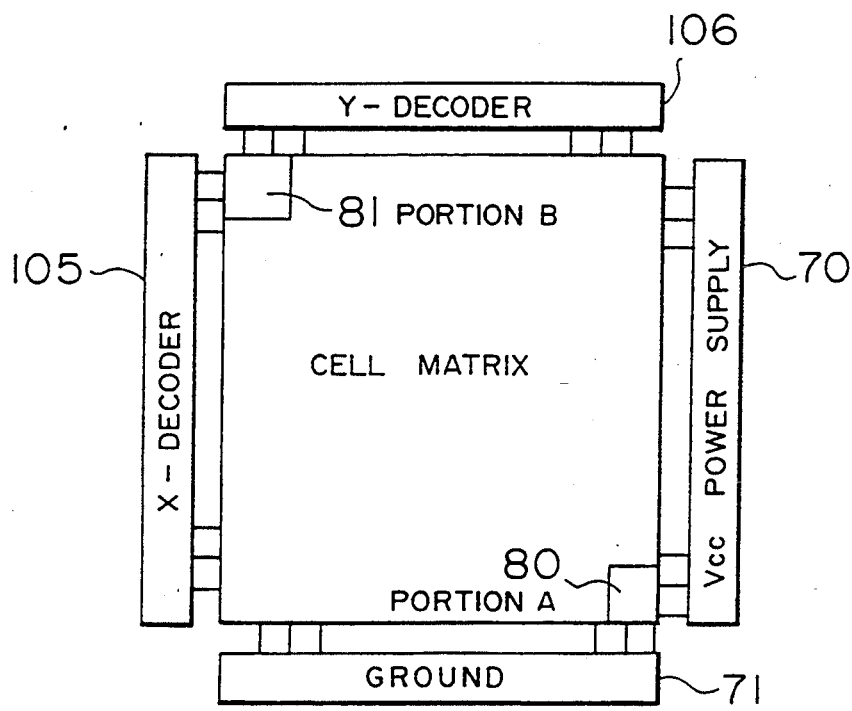
FIG. 8 is a view for explaining a wiring termination processing method for a matrix of interband single-electron transistor SRAM cells.
Figure 9:
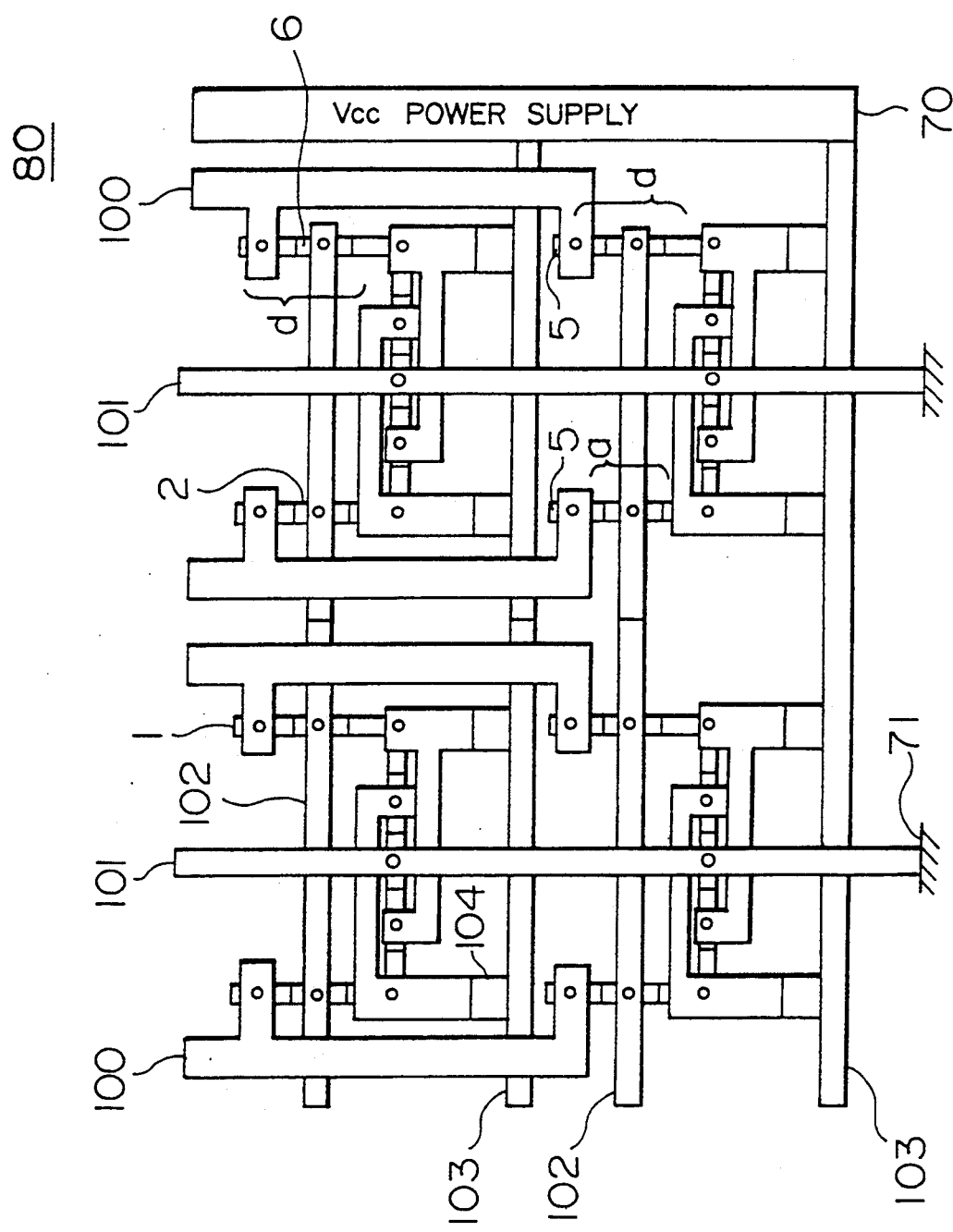
FIG. 9 is a view for explaining a terminal portion A of interband single-electron transistor SRAM cell matrix shown in FIG. 8.
Figure 10:
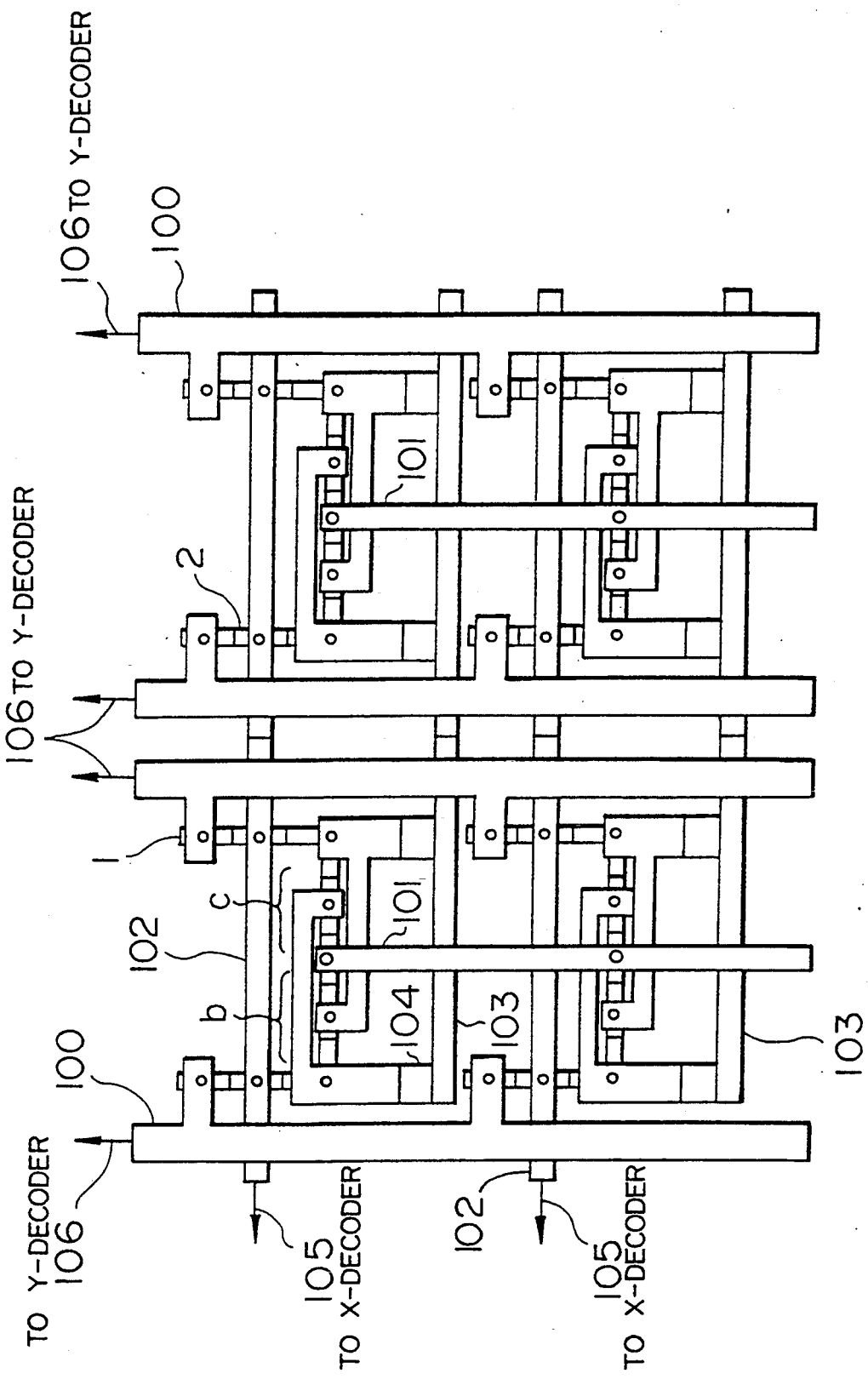
FIG. 10 is a view for explaining a terminal portion B of the interband single-electron transistor SRAM cell matrix shown in FIG. 8.

Next, a termination processing method for wiring at a terminal portion of the integrated circuit will be explained using FIGS. 8, 9 and 10. An embodiment of a wiring termination processing method for a portion A (80) shown in FIG. 8 is shown in FIG. 9, and an embodiment of a wiring termination processing method for a portion B (81) shown in FIG. 8 is shown in FIG. 10.

First, the embodiment of the wiring termination processing method for the portion A (80) shown in FIG. 8 will be explained with reference to FIG. 9. The ground line 101 is connected to the ground 71, and the $V_{CC}$ line 103 is connected to the $V_{CC}$ power supply 70. The data line 100 terminates at the source 5 of the transistor a or d of a SRAM cell arranged at the lowermost end of the integrated circuit. The symbols for transistors herein used follow the notation shown in FIG. 2. The word line 102 terminates at the gate 6 of the transistor d of a SRAM cell arranged at the rightmost end of the integrated circuit. Basically, the data line 100 and the ground line 101 at the lowermost end of the integrated circuit and the word line 102 and the $V_{CC}$ line 103 at the; rightmost end thereof terminate in the above-mentioned manner.

Next, the embodiment of the wiring termination processing method for the portion B (81) shown in FIG. 8 will be explained using FIG. 10. The word line 102 is connected to the X-decoder 105, and the data line 100 is connected to the Y-decoder 106. The ground line 101 terminates at the commonly used drains 4 of the transistors b and c at the uppermost end of the integrated circuit. The symbols for transistors herein used follow the notation shown in FIG. 2. The $V_{CC}$ line 103 terminates at a SRAM arranged at the leftmost end of the integrated circuit. Basically, the data line 100 and the ground line 101 at the uppermost end of the integrated circuit and the word line 102 and the $V_{CC}$ line 103 at the leftmost end thereof terminate in the above-mentioned manner.

Figure 11:
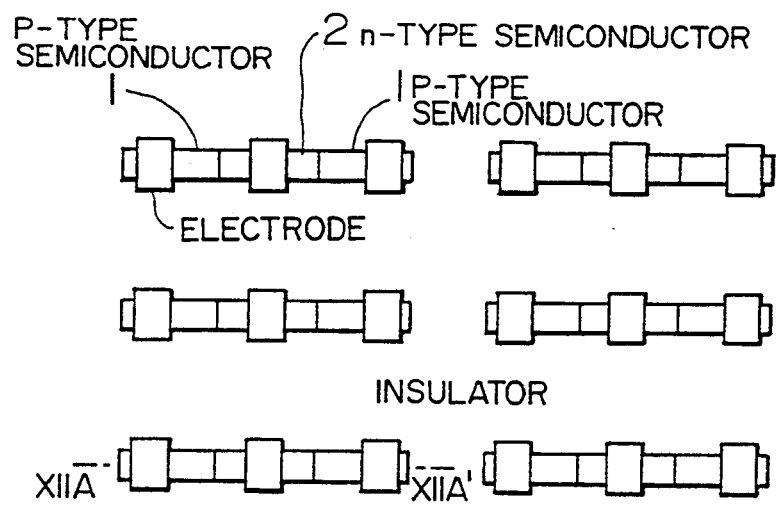
FIG. 11 is a view for explaining an interband single-electron transistor gate array.
Figure 12:
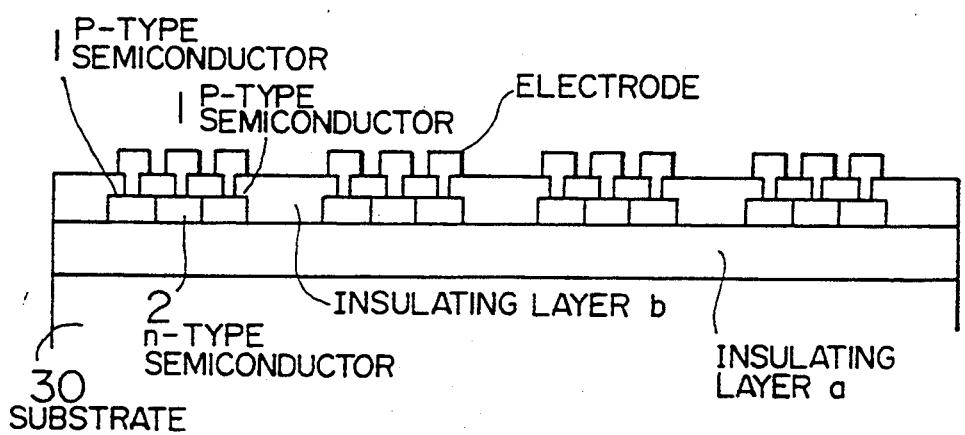
FIG. 12 is a cross section of the interband single-electron transistor gate array taken along line XIIA–XIIA' in FIG. 11.

Next, a gate array will be explained as another embodiment of the integrated circuit using interband single-electron tunnel transistors. FIG. 11 shows a top view of an interband single-electron tunnel transistor gate array, and FIG. 12 shows a cross section of the interband single-electron tunnel transistor gate array taken along line XIIA–XIIA' in FIG. 11. Basically, the interband single-electron tunnel transistor gate array shown in FIG. 11 is an array of transistors. Accordingly, a gate array is formed by wiring or interconnecting those transistors. Basically, the interband single-electron tunnel transistor gate array has a structure in which a multiple of interband single-electron tunnel transistors are periodically arranged, as shown in FIG. 11. Further, electrodes are respectively provided to the source 5, the drain 4 and the gate 6 of each transistor to allow any wiring or interconnection between transistors. Basically, the interconnection can be made in a form divided into a plurality of wiring layers. Also, various forms of wiring can be used for interconnection between interband single-electron tunnel transistors to provide various logic circuits.

Next, a cross-sectional structure of the interband single-electron tunnel transistor gate array will be explained with reference to FIG. 12. An insulator a is formed on a substrate 30, and interband single-electron tunnel transistors are formed on the insulating layer a. An insulator material b is used as a protecting layer for wiring. In the case where silicon (Si) is used as the material of the substrate 30, silicon dioxide (SiO$_2$) is used as the insulating layer a. Further, poly-silicon doped with boron (B) is used as a p-type semiconductor material 1 and polysilicon doped with phosphor (P) or arsenic (As) is used as an n-type semiconductor material 2. A material such as silicon dioxide used as a protecting layer in the conventional semiconductor manufacturing process is used for the insulating layer b which is the protecting layer. In the case where GaAs is used as the material of the substrate 30, AlGaAs is used as the insulating layer a. Further, GaAs doped with beryllium (Be) or zinc (Zn) is used as the p-type semiconductor material 1 and GaAs doped with silicon or platinum (Pt) is used as the n-type semiconductor material 2. A material such as silicon dioxide used as a protecting layer in the conventional semiconductor manufacturing process is used for the insulating layer b which is the protecting layer for a wiring layer.

Figure 13:
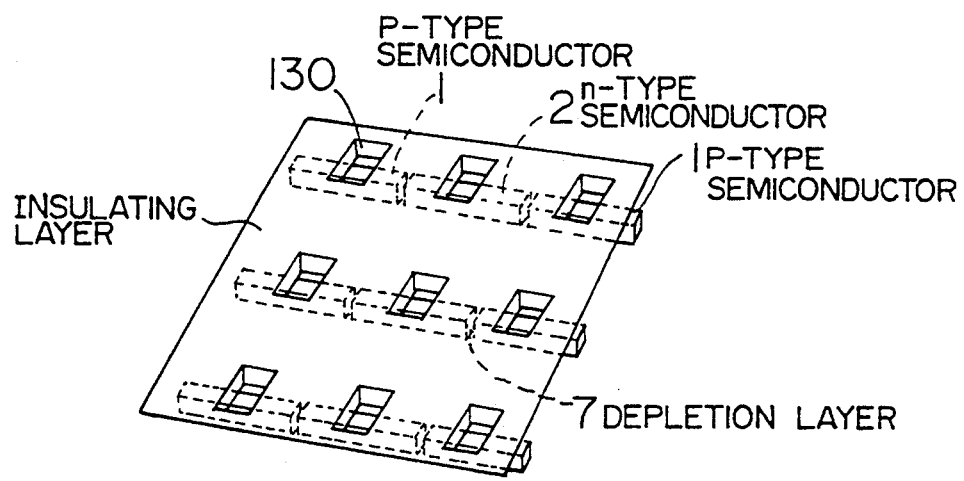
FIG. 13 is a first view for explaining the wiring or interconnection in the interband single-electron transistor gate array.
Figure 14:
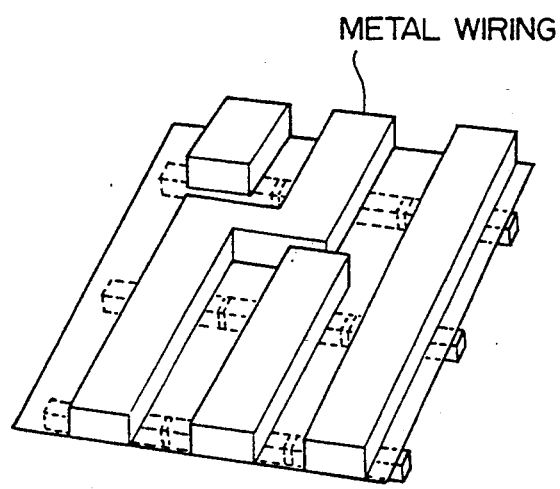
FIG. 14 is second view for explaining the wiring in the interband single-electron transistor gate array.

Next, wiring in the interband single-electron tunnel transistor gate array will be explained with reference to FIGS. 13 and 14. FIG. 13 shows an embodiment of contact holes 130 in the interband single-electron tunnel transistor gate array. Usually, an interband single-electron tunnel transistor takes a very thin rectangular parallelepiped of the order of 0.1 μm. However, the usual wiring width is thicker that 0.1 μm. Accordingly, in order to surely connect wiring to the interband single-electron transistor, it is necessary to provide a contact hole 130 the area or opening of which increases in a direction toward the overlying wiring side. FIG. 14 shows an embodiment of wiring of interband single-electron tunnel transistors using such contact holes 130 with widened skirts. This embodiment of wiring can be applied to the case where wiring is made in a SRAM using interband single-electron tunnel transistors.

Figure 15:
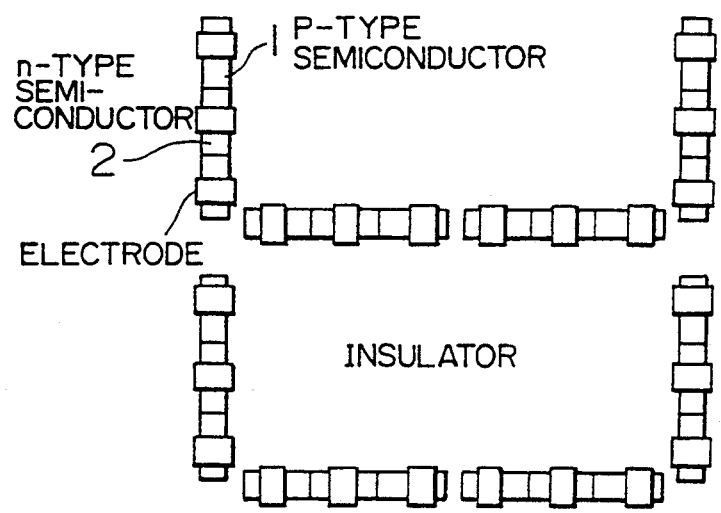
FIG. 15 is a view for explaining another embodiment of the arrangement of transistors in the interband single-electron transistor gate array.
Figure 16:
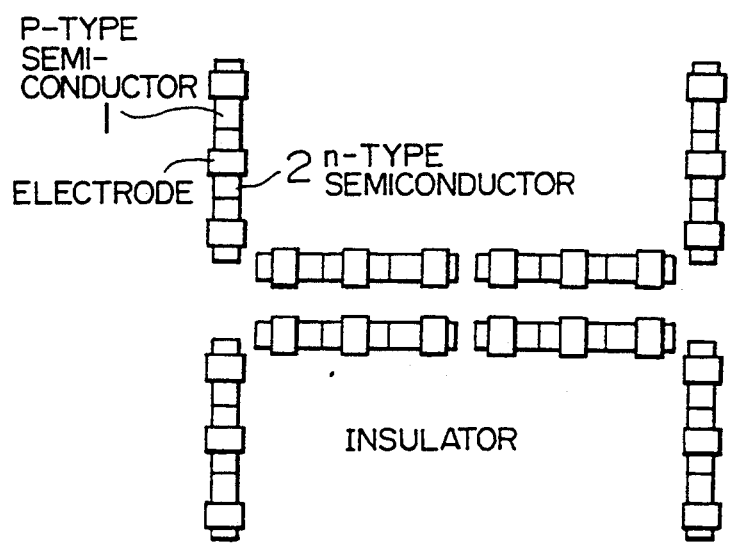
FIG. 16 is a view for explaining a further embodiment of the arrangement of transistors in the interband single-electron transistor gate array.
Figure 17:
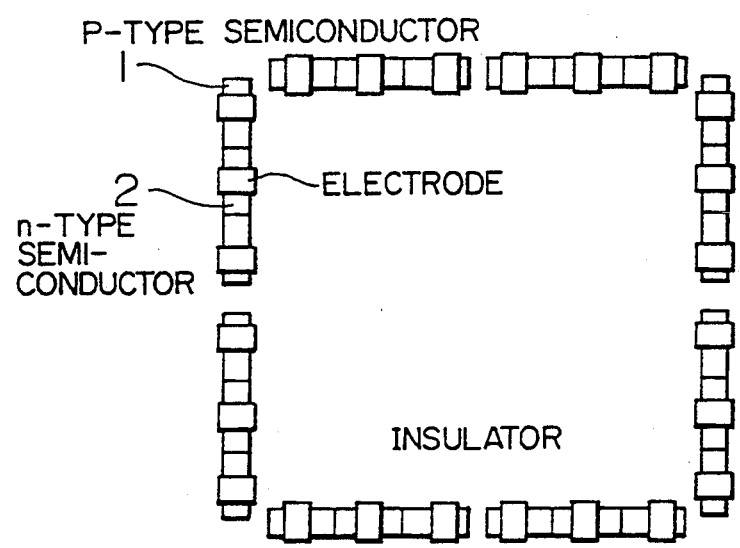
FIG. 17 is a view for explaining a still further embodiment of the arrangement of transistors in the interband single-electron transistor gate array.

Next, other embodiments of arrangement of interband single-electron tunnel transistors in the interband single-electron tunnel gate array will be shown with reference to FIGS. 15, 16 and 17. How to arrange interband single-electron tunnel transistors depends upon what logic circuit should be formed. However, whatever arrangement is taken for the interband single-electron tunnel transistors, the fabrication process is not very complicated. The arrangements of gate arrays shown in FIGS. 15, 16 and 17 correspond to the arrangements of SRAM cells shown in FIGS. 2, 6 and 5, respectively, and the wiring between gate arrays to be made after local wiring between transistors included in each gate array can be made in a manner similar to that in FIG. 1 or 4.

Next, an embodiment of a fabrication process of an interband single-electron tunnel transistor integrated circuit will be explained with reference to FIGS. 18 to 22. As shown in FIG. 18B—B, an insulating layer 31 is first formed on a substrate 30 shown in FIG. 18A—A. In the case where silicon is used as the material of the substrate 30, silicon dioxide (SiO$_2$) is used as the insulating layer 31. In the case where GaAs is used as the substrate material, AlGaAs is used as the insulating layer. Next, a p-type semiconductor layer 1 is formed on the insulating layer 30, as shown in FIG. 18C—C. In the case where silicon (Si) is used as the substrate material, poly-silicon doped with boron (B) is used as the p-type semiconductor layer 1. When the poly-silicon doped with boron is formed, CVD is used. If amorphous silicon doped with boron (B) is formed at a low temperature and is thereafter subjected to heat treatment to make a structural change to poly-silicon, poly-silicon having a larger mobility is obtained. In the case where GaAs is used as the substrate material, GaAs doped with beryllium (Be) or zinc (Zn) is used as the p-type semiconductor layer 1. Especially, when beryllium is injected, MBE is generally used. When zinc (Zn) is injected, MOCVD is generally used. After the p-type semiconductor layer 1 has been formed on the insulating layer 31, an insulating layer 180 as an ion implantation mask is formed on the p-type semiconductor layer 1, and the insulating layer 180 on a portion of the p-type semiconductor layer to be converted into an n-type semiconductor layer is etched, as shown in FIG. 18D—D.

Next, an n-type impurity is ion-implanted, as shown in FIGS. 19A-E. In the case where silicon (Si) is used as the substrate material, phosphor (P) or arsenic (As) is implanted. In the case where GaAs is used as the substrate material, silicon (Si) or platinum (Pt) is implanted. After ion implantation, the insulating layer 80 as the ion implantation mask is removed, as shown in FIGS. 19B-F. A thin mixed layer including the mixture of p-type and n-type layers is formed by the above process.

Next, unnecessary semiconductor layer portions are etched to provide interband single-electron tunnel transistors formed on the insulating layer 31, as shown in FIG. 20. Further, a wiring protecting layer 210 is formed on the interband single-electron tunnel transistors, as shown in FIGS. 21A-G, and wiring contact holes 211 are provided in the wiring protecting layer 210, as shown in FIGS. 21B-H. In either the case where silicon (Si) is used as the substrate material or the case where GaAs is used as the substrate material, a material such as silicon dioxide (SiO$_2$) used as a protecting layer in the conventional semiconductor manufacturing process is used as the insulating layer 210 which is the wiring protecting layer.

Next, wiring 220 is formed using the contact holes, as shown in FIGS. 22A-I. In the case where a second wiring layer and so on are to be formed after the first wiring layer 220 has been completed, a second wiring protecting layer 221 is formed on the first wiring layer 220, as shown in FIGS. 22B-J, and a wiring process similar to that of the first wiring layer is repeated. After the uppermost wiring layer has been completed, a protecting film is formed on the uppermost wiring layer, as shown in FIGS. 22C-K, thereby completing the fabrication process of the interband single-electron tunnel transistor integrated circuit.

According to the present invention, a single-electron tunnel transistor is obtained in which the deterioration of the device resulting from the deterioration of an insulating layer is eliminated by using a p-n junction microcapacity as a fundamental constituent element of an interband single-electron tunnel transistor and the fabrication process is much simplified by reducing the number of insulating layers by one. Also, the use of interband single-electron tunnel transistors according to the present invention makes it possible to provide an integrated circuit such as a SRAM or gate array which has a high reliability and a fabrication method in which the fabrication process is simple.

We claim:

1. An interband tunnel transistor comprising three semiconductor layers which are combined through depletion layers, each depletion layer being formed by a p-n junction of a p-type semiconductor and an n-type semiconductor, wherein a width of each depletion layer is set to allow an electron to perform an interband tunnel operation between a p-type semiconductor conduction band through each of the depletion layers at a designated operation temperature when a predetermined voltage is applied to a central layer among the three semiconductor layers, and further wherein the width of the depletion layer is set to inhibit the interband tunnel operation at the operation temperature when the application of the predetermined voltage to the central layer is turned off.

2. An interband tunnel transistor according to claim 1, wherein said transistor is formed as one of a p-n-p and an n-p-n structure including semiconductor portions spaced apart from one another as a source and a drain and a semiconductor portion at a central portion between the source and drain as a gate, a fixed voltage being applied between the source and the drain and a current between the source and the drain due to the interband tunnel operation being turned on or off in response to whether or not a voltage is applied to the gate.

3. An integrated circuit comprising a plurality of interband tunnel transistors, each of which comprises three semiconductor layers which are combined through depletion layers, each depletion layer being formed by a p-n junction of a p-type semiconductor and an n-type semiconductor, wherein a width of each depletion layer is set to allow an electron to perform an interband tunnel operation between a p-type semiconductor valence band and an n-type semiconductor conduction band through each of the depletion layers at a designated operation temperature when a predetermined voltage is applied to a central layer among the three semiconductor layers, wherein the width of the depletion layer is set to inhibit the interband tunnel operation at the operation temperature when the application of the predetermined voltage to the central layer is turned off, and wherein each of said transistors is formed as one of a p-n-p and n-p-n structure including semiconductor portions spaced apart from one another as a source and a drain and a semiconductor portion at a central portion between the source and drain as a gate, a fixed voltage being applied between the source and the drain and a current between the source and the drain due to the interband tunnel operation being turned on or off in response to whether or not a voltage is applied to the gate.

4. An integrated circuit according to claim 3, wherein four of said interband tunnel transistors as a unit cell are arranged in a U-like structure and connected with one after another such that one of the drain and source of one of said four transistors is shared as one of the drain and source of another transistor.

5. An integrated circuit according to claim 3, wherein each of the source, the gate and the drain of each transistor is connected to a wiring pattern through a contact hole which is provided in an insulating layer therebetween, the contact hole having an increasing area towards the wiring pattern from the transistor.

6. An integrated circuit according to claim 3, wherein a predetermined number of ones of said interband tunnel transistors forms a unit cell, a plurality of said unit cells being arranged in a matrix manner, and said integrated circuit further comprises:

patterns for ground lines, power supply lines, word lines and data lines, each pattern being connected to a unit cell;

decoder means for selecting a specific unit cell from among the unit cells, arranged in the matrix manner, through the word lines and the data lines in response to an input of an address; and driving means for driving the selected unit cell to read data therefrom or to write data therein.

7. A gate array comprising:

interband tunnel transistors each comprising three semiconductor layers which are combined through depletion layers, each depletion layer being formed by a p-n junction of a p-type semiconductor and an n-type semiconductor, wherein a width of each depletion layer is set to allow an electron to perform an interband tunnel operation between a p-type semiconductor valence band and an n-type semiconductor conduction band through each of the depletion layers at a designated operation temperature when a predetermined voltage is applied to a central layer among the three semiconductor layers, wherein the width of the depletion layer is set to inhibit the interband tunnel operation at the operation temperature when the application of the predetermined voltage to the central layer is turned off, and wherein each of said transistors is formed as one of a p-n-p and n-p-n structure including semiconductor portions spaced apart from one another as a source and a drain and a semiconductor portion at a central portion between the source and drain as a gate, a fixed voltage being applied between the source and the drain and a current between the source and the drain due to the interband tunnel operation being turned on or off in response to whether or not a voltage is applied to the gate; and wiring patterns provided for connecting said transistors based on a desired logic.

8. A gate array according to claim 7, wherein each of the source, the gate and the drain of each transistor is connected to a wiring pattern through a contact hole which is provided in an insulating layer therebetween, the contact hole having an increasing area towards the wiring pattern from the transistor.

9. An interband tunnel transistor comprising:

an insulating layer formed on a substrate;

a semiconductor island having three portions each formed in the insulating layer and jointed one after another, two portions on both end sides of said island being of one of p-type and n-type conductivity and a central portion between said two portions being of a conductivity type opposite to that of said two portions.

10. An interband tunnel transistor comprising two p-n junctions, in which one of p-type and n-type semiconductors are shared, wherein the p-type semiconductor is doped with an impurity such that a Fermi level overlaps its valence band and the n-type semiconductor is doped with an impurity such that the Fermi level overlaps its conduction band, and wherein a depletion layer formed by each p-n junction has a width allowing an interband tunnel between each p-n junction at a predetermined voltage applied to the n-type semiconductor.

11. An integrated circuit comprising a plurality of interband tunnel transistors, each of which comprises two p-n junctions, in which one of p-type and n-type semiconductors are shared, wherein the p-type semiconductor is doped with an impurity such that a Fermi level overlaps its valence band and the n-type semiconductor is doped with an impurity such that the Fermi level overlaps its conduction band, and wherein a depletion layer formed by each p-n junction has a width allowing an interband tunnel between each p-n junction at a predetermined voltage applied to the n-type semiconductor.

12. An integrated circuit comprising a plurality of interband tunnel transistors, each of which comprises two p-n junctions, wherein said transistor is formed as one of a p-n-p and n-p-n structure including semiconductor portions spaced apart from one another as a source and a drain and a semiconductor portion at a central portion between the source and drain as a gate, a fixed voltage being applied between the source and the drain and a current between the source and the drain due to an interband tunnel being turned on or off in response to whether or not a voltage is applied to the gate, and wherein four of said interband tunnel transistors as a unit cell are connected one after another such that one of the drain and source of one of said four transistors is shared as one of the drain and source of another transistor.

13. An integrated circuit according to claim 12, wherein four of said interband tunnel transistors as a unit cell are arranged in a U-like structure.

* * * * *